(12) United States Patent
Matsutani et al.

(10) Patent No.: US 9,786,576 B2
(45) Date of Patent: Oct. 10, 2017

(54) POSITIVE-TYPE PHOTOSENSITIVE RESIN COMPOSITION, METHOD FOR PRODUCTION OF RESIST PATTERN, SEMICONDUCTOR DEVICE, AND ELECTRONIC DEVICE

(75) Inventors: Hiroshi Matsutani, Hitachi (JP); Takumi Ueno, Hitachi (JP); Alexandre Nicolas, Hitachi (JP); Ken Nanaumi, Chikusei (JP)

(73) Assignee: HITACHI CHEMICAL COMPANY, LTD, Tokyo (JP)

( * ) Notice: Subject to any disclaimer, the term of this patent is extended or adjusted under 35 U.S.C. 154(b) by 1490 days.

(21) Appl. No.: 12/741,854

(22) PCT Filed: Nov. 7, 2008

(86) PCT No.: PCT/JP2008/070323
§ 371 (c)(1),
(2), (4) Date: Jun. 24, 2011

(87) PCT Pub. No.: WO2009/063808
PCT Pub. Date: May 22, 2009

(65) Prior Publication Data
US 2011/0250396 A1    Oct. 13, 2011

(30) Foreign Application Priority Data
Nov. 12, 2007  (JP) ................. 2007-293631

(51) Int. Cl.
*B32B 3/30*  (2006.01)
*G03F 7/20*  (2006.01)
(Continued)

(52) U.S. Cl.
CPC ........ *H01L 23/3171* (2013.01); *G03F 7/0236* (2013.01); *G03F 7/40* (2013.01);
(Continued)

(58) Field of Classification Search
CPC ...................................................... C08L 61/14
See application file for complete search history.

(56) References Cited

U.S. PATENT DOCUMENTS 3,957,512 A     5/1976  Kleeberg et al.
4,336,347 A  *  6/1982  Sagoh et al. .................. 525/139
(Continued)

FOREIGN PATENT DOCUMENTS

EP    0 087 262    8/1983
GB    2192636      1/1988
(Continued)

OTHER PUBLICATIONS

Machine translation of JP2007217657A.*
(Continued)

*Primary Examiner* — Ian Rummel
(74) *Attorney, Agent, or Firm* — Fitch Even Tabin & Flannery LLP

(57) ABSTRACT

A positive-type photosensitive resin composition includes (A) a phenol resin modified by a compound having an unsaturated hydrocarbon group having 4 to 100 carbon atoms; (B) a compound that produces an acid by light; (C) a thermal crosslinking agent; and (D) a solvent. The positive-type photosensitive resin composition according to the present invention can be developed by an alkaline aqueous solution, and an effect thereof is that a resist pattern having sufficiently high sensitivity and resolution, excellent adhesion, and good thermal shock resistance can be formed.

11 Claims, 5 Drawing Sheets

(51) Int. Cl.
    *G03F 7/004*    (2006.01)
    *H01L 23/31*    (2006.01)
    *G03F 7/023*    (2006.01)
    *G03F 7/40*     (2006.01)
    *H01L 23/00*    (2006.01)

(52) U.S. Cl.
    CPC .......... *H01L 23/3114* (2013.01); *H01L 24/13* (2013.01); *H01L 2224/05001* (2013.01); *H01L 2224/056* (2013.01); *H01L 2224/05008* (2013.01); *H01L 2224/05022* (2013.01); *H01L 2224/05024* (2013.01); *H01L 2224/05124* (2013.01); *H01L 2224/05572* (2013.01); *H01L 2924/10253* (2013.01); *H01L 2924/15788* (2013.01); *H01L 2924/181* (2013.01); *Y10T 428/24479* (2015.01)

(56) References Cited

U.S. PATENT DOCUMENTS

| | | | |
|---|---|---|---|
| 4,587,196 A * | 5/1986 | Toukhy | C08G 8/24 430/165 |
| 6,462,107 B1 | 10/2002 | Sinclair et al. | |
| 2004/0094752 A1* | 5/2004 | Ito et al. | 252/578 |
| 2006/0057468 A1 | 3/2006 | Igawa et al. | |

FOREIGN PATENT DOCUMENTS

| | | |
|---|---|---|
| JP | 49-115541 | 11/1974 |
| JP | 59-108031 | 6/1984 |
| JP | 60-208377 | 10/1985 |
| JP | 07-306532 | 11/1995 |
| JP | 09-096904 | 4/1997 |
| JP | 10-171112 | 6/1998 |
| JP | 2001-019799 | 1/2001 |
| JP | 2003-215789 | 7/2003 |
| JP | 2004-002753 | 1/2004 |
| JP | 2004-190008 | 7/2004 |
| JP | 2006-106214 | 4/2006 |
| JP | 3812654 | 6/2006 |
| JP | 2007217657 A * | 8/2007 |
| JP | 2007-316577 | 12/2007 |
| WO | WO 99/32936 | 7/1999 |
| WO | WO 02/102867 | 12/2002 |
| WO | WO 2004/006020 | 1/2004 |

OTHER PUBLICATIONS

J. Kusunoki, et al., "Low Temperature Curable Photosensitive Dielectric Materials for WLP Applications", *Journal of Photopolymer Science and Technology*, vol. 18, No. 2 (2005), pp. 321-325.

"The Latest Polyimide", Edited by Japan Polyimide Study Group, 2002.

Chinese Official Action dated Aug. 31, 2011, for CN Application No. 200880115804.9.

Extended European Search Report dated Jan. 4, 2011, including Supplementary European Search Report and European Search Opinion, for EP Application No./Patent No. 08848939.8-2222/ 2221666 (PCT/JP2008/070323).

Translation of the International Preliminary Report on Patentability dated Jul. 8, 2010, for International Application No. PCT/JP2008/070323.

Taiwanese Official Action dated Aug. 10, 2012, for TW Application No. 097143505.

* cited by examiner

POSITIVE-TYPE PHOTOSENSITIVE RESIN COMPOSITION, METHOD FOR PRODUCTION OF RESIST PATTERN, SEMICONDUCTOR DEVICE, AND ELECTRONIC DEVICE

TECHNICAL FIELD

The present invention relates to a positive-type photosensitive resin composition, a method for production of a resist pattern, a semiconductor device, and an electronic device.

BACKGROUND ART

In recent years, higher integration of a semiconductor element and increase in size have progressed, and there has been a demand for a thinner and miniaturized encapsulating resin package. Accompanied by this demand, a surface protection layer and an interlayer insulation film of the semiconductor element and a redistribution layer of a semiconductor package are needed to be formed of a material having more excellent electrical properties, thermal resistance, mechanical properties, and the like. Polyimide resins are one of the materials that may satisfy such demanded properties. For example, use of a photosensitive polyimide obtained by giving photosensitive properties to a polyimide resin has been considered. Use of the photosensitive polyimide has advantages that a pattern formation step is simplified and a complicated manufacturing step can be reduced (for example, see Patent Documents 1 and 2).

A film of a polyimide resin is usually formed by forming a thin film by a method such as a spin coat method using a solution (the so-called varnish) of a polyimide precursor (polyamide acid) obtained by reacting tetracarboxylic dianhydride with diamine, and performing thermal dehydration and ring closure (for example, see Non-Patent Document 1). The polyimide resin cures through this process of dehydration and ring closure. Unfortunately, the case of the polyimide resin using the polyimide precursor has a problem that volume shrinkage attributed to dehydration (imidization) occurs so that loss of a thickness and reduced dimensional accuracy occur in the time of curing. Moreover, a film formation step at a low temperature is desired lately, and there is a demand for a polyimide resin having an ability such that dehydration and ring closure of the polyimide resin is possible at a low temperature, and physical properties of the film after dehydration and ring closure bear comparison with those of a film obtained by dehydration and ring closure at a high temperature. However, curing of the polyimide precursor at a low temperature leads to imperfect imidizing. For this reason, the physical properties thereof deteriorate, for example, the cured film to be formed becomes fragile.

On the other hand, a photosensitive resin obtained by using other polymer that does not need to undergo dehydration and ring closure unlike the case of the polyimide precursor, and has high thermal resistance has been examined (for example, Non-Patent Document 2, Patent Documents 3 to 7). Particularly, in recent years, in application of the surface protection film and cover the coat layer for the semiconductor device having the redistribution layer, a positive-type photosensitive resin composition that can be developed by an alkaline aqueous solution and can form a resist pattern having higher thermal resistance has been demanded from the viewpoint of reduced environmental impact.

[Patent document 1] Japanese Unexamined Patent Publication SHO No. 49-115541
[Patent document 2] Japanese Unexamined Patent Publication SHO No. 59-108031
[Patent document 3] International Patent Publication No. WO2004/006020
[Patent document 4] Japanese Unexamined Patent Publication No. 2006-106214
[Patent document 5] Japanese Unexamined Patent Publication No. 2004-2753
[Patent document 6] Japanese Unexamined Patent Publication No. 2004-190008
[Patent document 7] Japanese Patent Publication No. 3812654
[Non-Patent Document 1] Saishin Poriimido Kiso to Ouyou, edited by Nihon Poriimido Kenkyuukai (2002)
[Non-Patent Document 2] J. Photopolym. Sci. Technol. 2005, vol. 18, p. 321-325

DISCLOSURE OF THE INVENTION

However, such an ability to be developed by an alkaline aqueous solution and improved sensitivity, resolution, adhesion, and thermal shock resistance are demanded of the polymer that does not need dehydration and ring closure.

Then, an object of the present invention is to provide a positive-type photosensitive resin composition that can be developed by an alkaline aqueous solution and can form a resist pattern having sufficiently high sensitivity and resolution and excellent adhesion and thermal shock resistance, a method for production of a resist pattern using the positive-type photosensitive resin composition, a semiconductor device having the resist pattern formed by the method, and an electronic device including the semiconductor device.

The present invention provides a positive-type photosensitive resin composition containing: (A) a phenol resin modified by a compound having an unsaturated hydrocarbon group having 4 to 100 carbon atoms, (B) a compound that produces an acid by light, (C) a thermal crosslinking agent, and (D) a solvent.

According to the positive-type photosensitive resin composition, it is possible to form a resist pattern having sufficiently high sensitivity and resolution, excellent adhesion, and good thermal shock resistance. Although a reason that such an effect is obtained by the positive-type photosensitive resin composition according to the present invention is not always obvious, the present inventors consider the reason as follows.

The above-mentioned positive-type photosensitive resin composition includes a phenol resin modified by a compound having an unsaturated hydrocarbon group having 4 to 100 carbon atoms as the component (A). A photosensitive resin film made of the positive-type photosensitive resin composition containing the phenol resin modified by a compound having an unsaturated hydrocarbon group having 4 to 100 carbon atoms is exposed, developed, and heated. The compound having an unsaturated hydrocarbon group having 4 to 100 carbon atoms has a double bond in the molecule. For that reason, curing of the patterned photosensitive resin film sufficiently progresses by crosslinking of this double bond. Hence, it is considered that adhesion and thermal shock resistance of the formed resist pattern improve. Moreover, it is considered that by using the component (A) with the above-mentioned (B) to (D) components, the positive-type photosensitive resin composition according to the present invention achieves sufficiently high sensitivity and resolution simultaneously.

Preferably, the component (B) is an o-quinone diazide compound because the sensitivity in formation of the resist pattern further improves.

Preferably, the positive-type photosensitive resin composition according to the present invention contains 3 to 100 parts by mass of the component (B) based on 100 parts by mass of the component (A) because the resolution in formation of the resist pattern further improves.

Preferably, the above-mentioned positive-type photosensitive resin composition further includes (E) an elastomer. Thereby, a cured film obtained has excellent flexibility and can further improve thermal shock resistance.

Moreover, a method for production of a resist pattern according to the present invention includes the steps of: exposing a photosensitive resin film comprised of the above-mentioned positive-type photosensitive resin composition; developing the exposed photosensitive resin film by an alkaline aqueous solution to pattern the photosensitive resin film; and heating the patterned photosensitive resin film. According to such a production method, because the above-mentioned positive-type photosensitive resin composition is used, the resist pattern having sufficiently high sensitivity and resolution and having good adhesion and thermal shock resistance can be formed.

In the method for production of a resist pattern according to the present invention, the patterned photosensitive resin film is preferably heated at a temperature of not more than 200° C. Thereby, damages to an electronic device caused by heat can be sufficiently prevented.

Further, the present invention provides a semiconductor device having the resist pattern formed by the above-mentioned production method as an interlayer insulation film or a surface protection layer. The semiconductor device demonstrates a high degree of effectiveness because the semiconductor device has the resist pattern made of the above-mentioned positive-type photosensitive resin composition.

A preferable aspect of the semiconductor device according to the present invention includes:

a semiconductor device having the resist pattern formed by the above-mentioned production method as a cover coat layer;

a semiconductor device having the resist pattern formed by the above-mentioned production method as a core for a redistribution layer;

a semiconductor device having the resist pattern formed by the above-mentioned production method as a collar for holding a conductive ball, which is an external connection terminal; and a semiconductor device having the resist pattern formed by the above-mentioned production method as an underfill.

Moreover, an electronic device according to the present invention includes the above-mentioned semiconductor device according to the present invention. Such an electronic device has sufficiently high reliability because the electronic device has the resist pattern made of the positive-type photosensitive resin composition according to the present invention.

Effect of the Invention

According to the present invention, it is possible to provide a positive-type photosensitive resin composition that can be developed by an alkaline aqueous solution and can form a resist pattern having sufficiently high sensitivity and resolution and excellent adhesion and thermal shock resistance. According to the positive-type photosensitive resin composition according to the present invention, the resist pattern can be formed by a low temperature heating process at a temperature of not more than 200° C. Consequently, damages to an electronic device caused by heat can be prevented, and a reliable semiconductor device can be provided at a high yield.

The present invention also provides a method for forming a resist pattern having sufficiently high sensitivity and resolution and having good adhesion and thermal shock resistance by using the positive-type photosensitive resin composition, a semiconductor device including the resist pattern formed by the method, and an electronic device including the semiconductor device. The resist pattern formed by the method of the present invention has a good shape and properties, and has little volume shrinkage at the time of curing therefore leading to high dimensional stability.

EXPLANATION OF SYMBOLS

Figure 1:
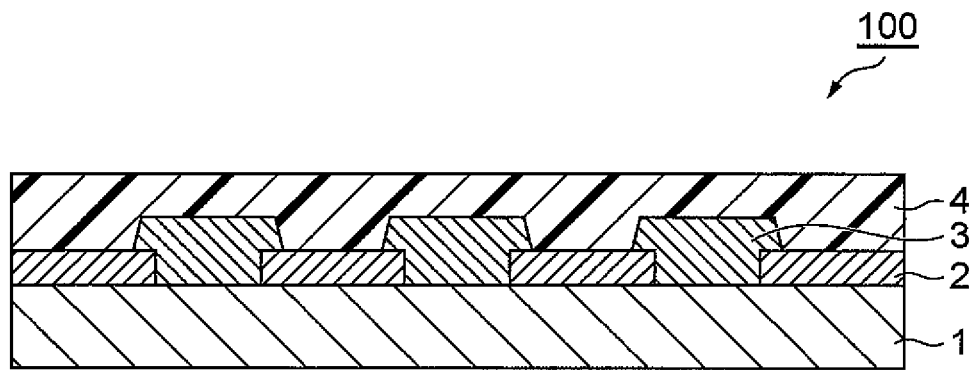
FIG. 1 is a schematic sectional view showing one embodiment of a step of producing a semiconductor device.

1 . . . semiconductor substrate, 2 . . . protective film, 3 . . . first conductive layer, 4 . . . interlayer insulation film, 5 . . . photosensitive resin layer, 6A, 6B, 6C . . . window portions, 7 . . . second conductive layer, 8 . . . surface protection layer, 11 . . . interlayer insulation film, 12 . . . wiring layer, 12 . . . underfill, 13 . . . insulating layer, 14 . . . surface protection layer, 15 . . . pad portion, 16 . . . redistribution layer, 17 . . . conductive ball, 18 . . . core, 19 . . . cover coat layer, 20 . . . barrier metal, 21 . . . collar, 22 . . . underfill, 23 . . . silicon chip, 24 . . . connection portion, 100, 200, 300, 400 . . . structure bodies, 500 . . . semiconductor device, 600 . . . semiconductor device, 700 . . . semiconductor device.

BEST MODES FOR CARRYING OUT THE INVENTION

Hereinafter, suitable embodiments according to the present invention will be described in detail referring to the drawings when necessary. Identical reference numbers will be given to identical components in the drawings, and repeated description thereof will be omitted. Positional relations such as four directions are based on positional relations shown in the drawings unless specified. Further, dimensional ratios in the drawings will not be limited to ratios shown. Moreover, "(meth)acrylate" herein means "acrylate" and "methacrylate" corresponding thereto. Similarly, "(meth)acrylic" means "acrylic" and "methacryl" corresponding thereto.

[A Positive-Type Photosensitive Resin Composition]

The positive-type photosensitive resin composition according to the present invention contains: (A) a phenol resin modified by a compound having an unsaturated hydrocarbon group having 4 to 100 carbon atoms, (B) a compound that produces an acid by light, (C) a thermal crosslinking agent, and (D) a solvent. Hereinafter, description will be given of each component contained in the positive-type photosensitive resin composition.

<A Component (A)>

A phenol resin modified by a compound having an unsaturated hydrocarbon group having 4 to 100 carbon atoms as the component (A) can be obtained by a polycondensation reaction of a reaction product (hereinafter, simply referred to as an "unsaturated hydrocarbon group modified phenol derivative" in some cases) of a phenol derivative and a compound having an unsaturated hydrocarbon group having 4 to 100 carbon atoms (hereinafter, referred to as an "unsaturated hydrocarbon group containing compound") with aldehydes.

Examples of the phenol derivative include phenol; alkylphenols such as o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, and 3,4,5-trimethylphenol; alkoxy phenols such as methoxyphenol and 2-methoxy-4-methyl phenol; alkenyl phenols such as vinylphenol and allylphenol; aralkyl phenols such as benzylphenol; alkoxy carbonyl phenols such as carbomethoxyphenol; arylcarbonyl phenols such as benzoyloxy phenol; halogenated phenols such as chlorophenol; polyhydroxy benzenes such as catechol, resorcinol, and pyrogallol; bisphenols such as bisphenol A and bisphenol F; naphthol derivatives such as α- or β-naphthol; hydroxyalkyl phenols such as p-hydroxyphenyl-2-ethanol, p-hydroxyphenyl-3-propanol, and p-hydroxyphenyl-4-butanol; hydroxyalkyl cresols such as hydroxyethyl cresol; monoethylene oxide adducts of bisphenol; alcoholic hydroxyl group containing phenol derivatives such as monopropylene oxide adducts of bisphenol; and carboxyl group containing phenol derivatives such as p-hydroxyphenylacetic acid and p-hydroxyphenylpropionic acid p-hydroxyphenyl butanoic acid, p-hydroxycinnamic acid, hydroxybenzoic acid, hydroxyphenylbenzoic acid, hydroxyphenoxybenzoic acid, and diphenolic acid. Moreover, methylolated products of the above-mentioned phenol derivatives such as bishydroxymethyl-p-cresol may be used as the phenol derivative. One kind of the phenol derivative is used alone, or not less than two kinds are used in combination.

Preferably, the unsaturated hydrocarbon group of the unsaturated hydrocarbon group containing compound includes not less than two unsaturated bonds from the viewpoint of the adhesion and thermal shock resistance of the resist pattern. Preferably, the unsaturated bond is not more than 30 from the viewpoint of preservation stability of the positive-type photosensitive resin composition. Moreover, from the viewpoint of compatibility in use as a resin composition and flexibility of a cured film, the unsaturated hydrocarbon group preferably has 8 to 80 carbon atoms, and more preferably has 10 to 60 carbon atoms.

Examples of the unsaturated hydrocarbon group containing compound include unsaturated hydrocarbons having 4 to 100 carbon atoms, polybutadiene having a carboxyl group, epoxidated polybutadiene, linoleyl alcohol, oleyl alcohol, unsaturated fatty acids, and unsaturated fatty acid esters. Examples of suitable unsaturated fatty acids include crotonic acid, myristoleic acid, palmitoleic acid, oleic acid, elaidic acid, vaccenic acid, gadoleic acid, erucic acid, nervonic acid, linoleic acid, α-linoleic acid, eleostearic acid, stearidonic acid, arachidonic acid, eicosapentaenoic acid, clupanodonic acid, and docosahexaenoic acid. Among them, esters of unsaturated fatty acids having 8 to 30 carbon atoms and monohydric to trihydric alcohols having 1 to 10 carbon atoms are particularly more preferable. Esters of unsaturated fatty acids having 8 to 30 carbon atoms and glycerol of a trihydric alcohol are particularly preferable.

Esters of unsaturated fatty acids having 8 to 30 carbon atoms with glycerol are commercially available as vegetable oil. The vegetable oil includes nondrying oil having an iodine number of not more than 100, semi-drying oil having an iodine number more than 100 and less than 130, and drying oil having an iodine number of not less than 130. Examples of the nondrying oil include olive oil, morning glory seed oil, cashew apple oil, sasanqua oil, camellia oil, castor oil, and peanut oil. Examples of the semi-drying oil include corn oil, cotton seed oil, and sesame oil. Examples of the drying oil include tung oil, linseed oil, soybean oil, walnut oil, safflower oil, sunflower oil, perilla oil, and poppy seed oil. Processed vegetable oils obtained by processing these vegetable oils may also be used.

The drying oil is preferably used from the viewpoint of improved adhesion, mechanical properties, and thermal shock resistance of the resist pattern, and tung oil and linseed oil are more preferable.

One kind of these unsaturated hydrocarbon group containing compounds is used alone, or not less than two kinds are used in combination.

In preparing the component (A), first, the above-mentioned phenol derivative is reacted with the above-mentioned unsaturated hydrocarbon group containing compound to produce an unsaturated hydrocarbon group modified phenol derivative. Preferably, the above-mentioned reaction is usually performed at 50 to 130° C. From the viewpoint of improving flexibility of the cured film, in the reaction ratio of the phenol derivative and the unsaturated hydrocarbon group containing compound, the unsaturated hydrocarbon group containing compound is preferably 1 to 100 parts by mass based on 100 parts by mass of the phenol derivative, and more preferably 5 to 50 parts by mass. The flexibility of the cured film is likely to deteriorate when the unsaturated hydrocarbon group containing compound is less than 1 part by mass, while the thermal resistance of the cured film is likely to deteriorate when the unsaturated hydrocarbon group containing compound exceeds 100 parts by mass. P-toluenesulfonic acid, trifluoro methanesulfonic acid, and the like may be used as a catalyst for the above-mentioned reaction when necessary.

Next, the above-mentioned unsaturated hydrocarbon group modified phenol derivative is reacted with aldehydes to produce a phenol resin modified by a compound having an unsaturated hydrocarbon group having 4 to 100 carbon atoms. Examples of aldehydes include formaldehyde, acetaldehyde, and furfural benzaldehyde, hydroxy benzaldehyde, methoxy benzaldehyde, hydroxyphenyl acetaldehyde, methoxypheny acetaldehyde, crotonaldehyde, chloroacetaldehyde, chlorophenyl acetaldehyde, acetone, and glyceraldehyde. Examples of aldehydes also include glyoxylic acid, glyoxylic acid methyl, glyoxylic acid phenyl glyoxylic acid hydroxyphenyl, formylacetic acid, formylacetic acid methyl, 2-formylpropionic acid, 2-formylpropionic acid methyl, pyruvic acid, Levulinic acid, 4-acetyl butyric acid, acetone dicarboxylic acid, and 3,3'-4,4'-benzophenone tetracarboxylic acid. Precursors of formaldehyde such as paraformaldehyde and trioxane may be used. One kind of these aldehydes is used alone, or not less than two kinds are used in combination.

The reaction of the above-mentioned aldehydes with the above-mentioned unsaturated hydrocarbon group modified phenol derivative is a polycondensation reaction. Conventionally known synthetic conditions on the phenol resins can be used. The reaction is preferably performed in the presence of a catalyst such as an acid or a base, and more preferably, an acid catalyst is used. Examples of the acid catalyst include hydrochloric acid, sulfuric acid, formic acid, acetic acid, p-toluenesulfonic acid, and oxalic acid, for example. One kind of these acid catalysts is used alone, or not less than two kinds are used in combination.

Preferably, the above-mentioned reaction is usually performed at a reaction temperature of 100 to 120° C. A reaction time varies depending on a kind and an amount of the catalyst to be used, and is usually 1 to 50 hours. After the reaction is terminated, the reaction product is dehydrated under reduced pressure at temperature of not more than 200° C. to obtain a phenol resin modified by the compound having an unsaturated hydrocarbon group having 4 to 100 carbon atoms.

Solvents such as toluene, xylene, and methanol can be used for the reaction.

Alternatively, the phenol resin modified by the compound having an unsaturated hydrocarbon group having 4 to 100 carbon atoms can be obtained by combining the compound obtained by reacting the above-mentioned phenol derivative and the unsaturated hydrocarbon group containing compound with a compound other than phenol, such as m-xylene, and polycondensing the product with aldehydes. In this case, preferably, a mole ratio of the compound other than phenol is less than 0.5 to the compound obtained by reacting the phenol derivative with the unsaturated hydrocarbon group containing compound.

A phenol resin acid-modified by further reacting the thus-obtained phenol resin modified by the compound having an unsaturated hydrocarbon group having 4 to 100 carbon atoms with a polybasic acid anhydride can be used as the component (A). Acid-modifying by the polybasic acid anhydride further improves solubility of the component (A) to an alkaline aqueous solution (developer).

The polybasic acid anhydride will not be particularly limited as long as the polybasic acid anhydride has a plurality of carboxylic acids and the carboxylic acids have a form subjected to dehydration condensation (acid anhydride). Examples of the polybasic acid anhydride includes dibasic acid anhydrides such as phthalic acid anhydride, succinic acid anhydride, octenylsuccinic acid anhydride, pentadodecenylsuccinic acid anhydride, maleic acid anhydride, and itaconic acid anhydride, tetrahydrophthalic acid anhydride, hexahydrophthalic acid anhydride, methyl tetrahydrophthalic acid anhydride, methyl hexahydrophthalic acid anhydride, Nadic acid anhydride, 3,6-endo-methylene-tetrahydrophthalic acid anhydride, methyl-endo-methylene-tetrahydrophthalic acid anhydride, tetrabromophthalic acid anhydride, and trimellitic acid anhydride; and aliphatic and aromatic 4-basic acid dianhydrides such as biphenyl tetracarboxylic acid dianhydride, naphthalene tetracarboxylic acid dianhydride, diphenyl ether tetracarboxylic acid dianhydride, butane tetracarboxylic acid dianhydride, cyclopentane tetracarboxylic acid dianhydride, pyromellitic acid dianhydride, and benzophenone tetracarboxylic acid dianhydride. One kind of these is used alone, or not less than two kinds are used in combination. Among these, the polybasic acid anhydride is preferably dibasic acid anhydrides, and more preferably, not less than one kind selected from the group consisting of tetrahydro phthalic anhydride, succinic anhydride, and hexahydro phthalic anhydride, for example. In this case, advantageously, a resist pattern having a good shape can be formed.

The above-mentioned reaction can be performed at 50 to 130° C. In the above-mentioned reaction, preferably 0.10 to 0.80 mol of the polybasic acid anhydride is reacted with 1 mol of phenolic hydroxy groups, more preferably 0.15 to 0.60 mol of the polybasic acid anhydride is reacted, and still more preferably 0.20 to 0.40 mol of the polybasic acid anhydride is reacted. The polybasic acid anhydride less than 0.10 mol is likely to deteriorate development properties, while the polybasic acid anhydride exceeding 0.80 mol is likely to deteriorate alkali resistance in an unexposed portion.

The above-mentioned reaction may include a catalyst when necessary from the viewpoint of a quick reaction. Examples of the catalyst include tertiary amines such as triethylamine, quarternary ammonium salts such as triethyl benzyl ammoniumchloride, imidazole compounds such as 2-ethyl-4-methylimidazole, and phosphorus compounds such as triphenyl phosphine.

The component (A) can also be obtained by reacting the phenol resin with the unsaturated hydrocarbon group containing compound. The phenol resin is a product by a polycondensation reaction of a phenol derivative with aldehydes. In this case, the same phenol derivative and aldehydes as those mentioned above can be used as the phenol derivative and the aldehydes, and the phenol resin can be synthesized on the conventionally known conditions mentioned above.

Examples of such a phenol resin obtained from the phenol derivative and aldehydes include a phenol/formaldehyde novolac resin, a cresol/formaldehyde novolac resin, a xylylenol/formaldehyde novolac resin, a resorcinol/formaldehyde novolac resin, and a phenol naphthol/formaldehyde novolac resin.

Next, the above-mentioned phenol resin is reacted with the unsaturated hydrocarbon group containing compound to produce a phenol resin modified by a compound having an unsaturated hydrocarbon group having 4 to 100 carbon atoms.

Preferably, the above-mentioned reaction of the phenol resin with the unsaturated hydrocarbon group containing compound is usually performed at 50 to 130° C. Moreover, from the viewpoint of improved flexibility of the cured film, in the reaction ratio of the phenol derivative and the unsaturated hydrocarbon group containing compound, the unsaturated hydrocarbon group containing compound is preferably 1 to 100 parts by mass based on 100 parts by mass of the phenol resin, and more preferably 5 to 50 parts by mass. The drying oil of less than 1 part by mass is likely to deteriorate the flexibility of the cured film while the drying oil exceeding 100 parts by mass is likely to deteriorate thermal resistance of the cured film. At this time, p-toluenesulfonic acid, trifluoro methanesulfonic acid, and the like may be used as a catalyst when necessary. Solvents such as toluene, xylene, methanol, and tetrahydrofuran can be used for the reaction.

A phenol resin acid-modified by further reacting the thus-obtained phenol resin modified by the compound having an unsaturated hydrocarbon group having 4 to 100 carbon atoms, which is a reaction product of the above-mentioned phenol resin and unsaturated hydrocarbon group containing compound, with a polybasic acid anhydride can be used as the component (A). Acid modifying with the polybasic acid anhydride further improves solubility of the component (A) to an alkaline aqueous solution (developer). In the reaction with the polybasic acid anhydride, the same conditions as those mentioned above can be used. Examples of the polybasic acid anhydride can include the same polybasic acid anhydrides as those mentioned above.

In consideration of a balance between solubility to the alkaline aqueous solution and photosensitivity and the physical properties of the cured film, the molecular weight of the component (A) is preferably 1000 to 500000 in a weight average molecular weight, more preferably 2000 to 200000, still more preferably 2000 to 100000, and most preferably 5000 to 50000. Here, the weight average molecular weight is a value obtained by performing measurement by a gel permeation chromatography method and conversion based on a standard polystyrene calibration curve.

<A Component (B)>

A compound as the component (B) that produces an acid by light is used as a sensitizing agent. Such a component (B) has function to produce an acid by irradiation of the component (B) with light and increase solubility of portions irradiated with the light to an alkaline aqueous solution. As the component (B), compounds usually referred to as a photo acid generator can be used. Examples of the component (B) include o-quinone diazide compounds, aryldiazonium salts, diaryliodonium salts, and triarylsulfonium salt. Among these, the o-quinone diazide compounds are preferable for their high sensitivity.

As the o-quinone diazide compounds, for example, compounds obtained by performing a condensation reaction of o-quinone diazide sulfonyl chlorides with a hydroxy compound or an amino compound in the presence of a dehydrochlorination agent can be used.

Examples of o-quinone diazide sulfonyl chlorides used for the reaction include benzoquinone-1,2-diazido-4-sulfonyl chloride, naphthoquinone-1,2-diazido 5-sulfonyl chloride, and naphthoquinone-1,2-diazido-4-sulfonyl chloride.

Examples of the hydroxy compounds used for the reaction include hydroquinone, resorcinol, pyrogallol, bisphenol A, bis(4-hydroxyphenyl)methane, 1,1-bis(4-hydroxyphenyl)-1-[4-{1-(4-hydroxyphenyl)-1-methylethyl}phenyl]ethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethyl indeno[2,1-a] indene, tris(4-hydroxyphenyl)methane, and tris(4-hydroxyphenyl)ethane.

Examples of the amino compounds used for the reaction include p-phenylenediamine, m-phenylenediamine, 4,4'-diaminodiphenylether, 4,4'-diaminodiphenylmethane, 4,4'-diaminodiphenyl sulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

Examples of the dehydrochlorination agent used for the reaction include sodium carbonate, sodium hydroxide, sodium hydrogencarbonate, potassium carbonate, potassium hydroxide, trimethylamine, triethylamine, and pyridine. As a reaction solvent, dioxane, acetone, methyl ethyl ketone, tetrahydrofuran, diethylether, N-methylpyrrolidone, and the like are used.

Preferably, o-quinone diazide sulfonyl chloride and the hydroxy compound and/or the amino compound are blended so that the total number of mols of hydroxy groups and amino groups may be 0.5 to 1 to 1 mol of o-quinone diazide sulfonyl chloride. The preferable blending ratio of the dehydrochlorination agent and o-quinone diazide sulfonyl chloride is within 0.95/1 mol equivalent to 1/0.95 mol equivalent.

The preferable reaction temperature in the above-mentioned reaction is 0 to 40° C., and the preferable reaction time is 1 to 10 hours.

From the viewpoint of a difference in a dissolution rate between an exposed portion and an unexposed portion and tolerance of sensitivity, the blending amount of such a component (B) is preferably 3 to 100 parts by mass based on 100 parts by mass of the component (A), more preferably 5 to 50 parts by mass, and most preferably 5 to 30 parts by mass.

<A Component (C)>

By containing the thermal crosslinking agent as the component (C), the component (A) reacts with the component (C) to be crosslinked when a patterned photosensitive resin film is heated and cured. This can prevent brittleness and melting of the film. Specifically, compounds having a phenolic hydroxy group, compounds having a hydroxy methylamino group, and compounds having an epoxy group can be used as the component (C).

The compounds having a phenolic hydroxyl group are different from the component (A). The compounds having a phenolic hydroxy group not only can act as the thermal crosslinking agent, but also increase a dissolution rate of an exposed portion at the time of development of the exposed portion by an alkaline aqueous solution to improve sensitivity. A molecular weight of such a compound having a phenolic hydroxy group is preferably not more than 2000. In consideration of a balance between solubility to an alkaline aqueous solution and photosensitivity and the physical properties of the cured film, a number average molecular weight of the compound is preferably 94 to 2000, more preferably 108 to 2000, and most preferably 108 to 1500.

Conventionally known compounds can be used as the compound having a phenolic hydroxy group. The compound represented by the following general formula (I) is particularly preferable for an excellent balance between the effect of accelerating dissolution of the exposed portion and the effect of preventing melting at the time of curing the photosensitive resin film:

[Chemical Formula 1]

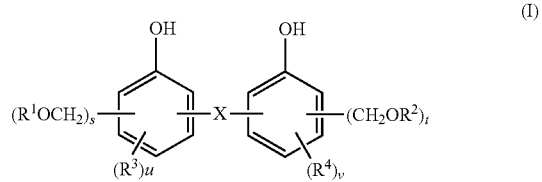

wherein X designates a single bond or a divalent organic group, $R^1$, $R^2$, $R^3$, and $R^4$ each designate a hydrogen atom or a univalent organic group separately, s and t each designate an integer of 1 to 3 separately, and u and v each designate an integer of 0 to 4 separately.

In the general formula (I), a compound in which X is single-bonded is a biphenol (dihydroxy biphenyl) derivative. Examples of a divalent organic group designated by X include a methylene group, an ethylene group, alkylene groups having 1 to 10 carbon atoms such as a propylene group and the like, alkylidene groups having 2 to 10 carbon atoms such as an ethylidene group and the like, allylene groups having 6 to 30 carbon atoms such as a phenylene groups and the like, groups in which a part of or all of the hydrogen atoms of these hydrocarbon groups are substituted for halogen atoms such as fluorine atoms, a sulfonyl group, a carbonyl group, an ether bond, a thioether bond, and an amido bond. Among these, preferably, X is a divalent organic group represented by the following general formula (II):

[Chemical Formula 2]

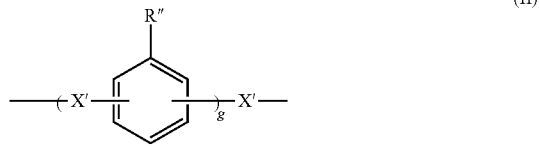

wherein X' designates a single bond, alkylene group (for example, alkylene groups having 1 to 10 carbon atoms), alkylidene groups (for example, alkylidene groups having 2 to 10 carbon atoms), groups in which a part of or all of the hydrogen atoms of these hydrocarbon groups are substituted for a halogen atom, a sulfonyl group, a carbonyl group, an ether bond, a thioether bond, and an amide bond; R" designates a hydrogen atom, a hydroxyl group, an alkyl group, or a halo alkyl group, and g designates an integer of 1 to 10; a plurality of R"s may be the same, or may be different from each other.

Examples of the compound having a hydroxy methylamino group include nitrogen-containing compounds in which all or a part of activity methylol groups are alkyletherified, such as (poly)(N-hydroxymethyl)melamine, (poly)(N-hydroxymethyl)glycoluryl, (poly)(N-hydroxymethyl)benzoguanamine, (poly)(N-hydroxymethyl)urea. Here, examples of alkyl groups in alkyl ether include a methyl group, an ethyl group, a butyl group, or a combination of these. An oligomer ingredient obtained by self-condensation may be contained in part. Specific examples include hexakis(methoxymethyl)melamine, hexakis(butoxymethyl)melamine, tetrakis(methoxymethyl)glycoluryl, tetrakis(butoxymethyl)glycoluryl, and tetrakis(methoxymethyl)urea.

Conventionally known compounds can be used as the compound having an epoxy group. Specific examples of those include a bisphenol A type epoxy resin, a bisphenol F type epoxy resin, a phenol novolak type epoxy resin, a cresol novolak type epoxy resin, a cycloaliphatic epoxy resin, glycidyl amine, a heterocyclic epoxy resin, and polyalkylene glycol diglycidyl ether.

The following can also be used as the component (C) other than the compounds mentioned above: aromatic compounds having a hydroxymethyl group, such as bis[3,4-bis (hydroxymethyl)phenyl]ether and 1,3,5-tris(1-hydroxy-1-methylethyl)benzene; compounds having a maleimide group, such as bis(4-maleimide phenyl)methane and 2,2-bis[4-(4'-maleimide phenoxy)phenyl]propane; compounds having a norbornene skeleton; polyfunctional acrylate compounds; compounds having an oxetanyl group; compounds having a vinyl group; and blocked isocyanate compounds.

Among the component (C) mentioned above, the compounds having a phenolic hydroxy group and/or the compounds having a hydroxy methylamino group are preferable from the viewpoint of improvement in sensitivity and thermal resistance.

A blending amount of the component (C) is preferably 1 to 50 parts by mass based on 100 parts by mass of the component (A) from the viewpoint of a developing time, tolerance of a ratio of a remaining unexposed portion in the film, and the physical properties of the cured film, more preferably 2 to 30 parts by mass, and most preferably 3 to 25 parts by mass. One kind of the thermal crosslinking agent mentioned above is used alone, or not less than two kinds are used in combination.

<A Component (D)>

The component (D) is a solvent. The solvent contained in the positive-type photosensitive resin composition according to the present invention can facilitates application of the positive-type photosensitive resin composition onto a substrate to form a coating having a uniform thickness. Specific examples of the solvent include γ-butyrolactone, ethyl lactate, propylene glycol monomethyl ether acetate, benzyl acetate, n-butyl acetate, ethoxyethyl propionate, 3-methyl methoxy propionate, N-methyl-2-pyrrolidone, N,N-dimethylformamide, N,N-dimethylacetamide, dimethyl sulfoxide, hexamethyl phosphoryl amide, tetramethylen sulfone, diethyl ketone, diisobutyl ketone, methyl amyl ketone, cyclohexanone, propylene glycol monomethyl ether, propylene glycol monopropyl ether, propylene glycol monobutyl ether, and dipropylene glycol monomethyl ether.

One kind of these solvents is used alone, or not less than two kinds are used in combination. A blending amount of the component (D) is not limited in particular. Preferably, a proportion of the solvent in the positive-type photosensitive resin composition is adjusted to 20 to 90 mass %.

<A Component (E)>

Preferably, the positive-type photosensitive resin composition according to the present invention further contains an elastomer as a component (E) in order to give flexibility to a cured body of the positive-type photosensitive resin composition. Conventionally known elastomers can be used as the elastomer. Preferably, a polymer that forms the elastomer has a glass transition temperature (Tg) of not more than 20° C.

Examples of such an elastomer include styrene based elastomers, olefin based elastomers, urethane based elastomers, polyester based elastomers, polyamide based elastomers, acrylic elastomers, and silicone based elastomers. One kind of these can be used alone, or not less than two kinds can be used in combination.

Examples of the styrene based elastomers include a styrene-butadiene-styrene block copolymer, a styrene-isoprene-styrene block copolymer, a styrene ethylene-butylene-styrene block copolymer, a styrene-ethylene-propylene-styrene block copolymer, and a styrene-butadiene-methacrylate block polymer. As a component of the styrene based elastomers, styrene and styrene derivatives such as α-methylstyrene, 3-methylstyrene, 4-propylstyrene, and 4-cyclohexyl styrene, can be used.

Specific examples of the styrene based elastomers include TUFPRENE, SOLPRENE T, ASAPRENE T, and TUFTEC (these are made by Asahi Kasei Chemicals Corporation), Elastomer AR (made by Aronkasei Co., Ltd.), Kraton G, Califlex (these are made by Shell Japan), JSR-TR, TSR-SIS, DYNARON (these are made by JSR Corporation), DENKA STR (made by Denki Kagaku Kogyo Kabushiki Kaisha), QUINTAC (made by Zeon Corp.), TPE-SB series (made by Sumitomo Chemical Co., Ltd.), RABALON (made by Mitsubishi Chemical Corporation), SEPTON, HYBRAR (these are made by Kuraray Co., Ltd.), Sumiflex (made by Sumitomo Bakelite Co., Ltd.), Reostomer, Actimer (these are made by Riken Vinyl Industry Co., Ltd.), and PALALOID EXL series (made by Rohm and Hass Company).

Examples of the olefin system elastomers include copolymers of α-olefins having 2 to 20 carbon atoms (for example, ethylene propylene copolymers (EPR), ethylene-propylene-diene copolymers (EPDM)), copolymers of diene having 2 to 20 carbon atoms and α-olefin, carboxy modified NBR in which methacrylic acid and an epoxidated polybutadienebutadiene-acrylonitrile copolymer are copolymerized, ethylene-α-olefin copolymer rubbers, ethylene-α-olefin diene copolymer rubbers, propylene-α-olefin copolymer rubbers, and butene-α-olefin copolymer rubbers. Specific examples of α-olefins having 2 to 20 carbon atoms include ethylene, propylene, 1-butene, 1-hexene, and 4-methyl-1-pentene. Specific examples of dienes having 2 to 20 carbon atoms include dicyclopentadiene, 1,4-hexadiene, cyclooctanediene, methylene norbornene, ethylidene norbornene, butadiene, and isoprene.

Specific examples of the olefin system elastomers include Milastomer (made by Mitsui Oil Chemical Co. Ltd.), EXACT (made by Exxon Chemicals Patents Inc.), ENGAGE (made by the Dow Chemical Company), Nipol series (made by Zeon Corp.), hydrogenated styrene butadiene rubber DYNABON HSBR (made by JSR Corporation), butadiene-acrylonitrile copolymer NBR series (made by JSR Corporation), XER series of biterminal carboxyl group modified butadiene-acrylonitrile copolymers having a crosslinking point (made by JSR Corporation), BF-1000 of epoxidated polybutadiene obtained by partially epoxidating polybutadiene (made by Nippon Soda Co., Ltd.), liquefied butadiene-acrylonitrile copolymers HYCAR series (made by Ube Industries, Ltd.).

An urethane based elastomer is formed of structural units having a hard segment made of low molecular (short chain) diol and diisocyanate and a soft segment made of polymer (long chain) diol and diisocyanate. Examples of the polymer (long chain) diol include polypropylene glycol, polytetramethylene oxide, poly(1,4-butylene adipate), poly(ethylene-1,4-butylene adipate), polycaprolactone, poly(1,6-hexylene carbonate), poly(1,6-xylene neo pentylene adipate). The polymer (long chain) diol preferably has a number average molecular weight of 500 to 10000. Examples of the low molecular (short chain) diol include ethylene glycol, propylene glycol, 1,4-butanediol, and bisphenol A. The short chain diol preferably has a number average molecular weight of 48 to 500.

Specific examples of the urethane based elastomer include PANDEX T-2185 and T-2983N (these are made by Dainippon Ink & Chemicals, Inc.), and Silactone E790 and Hitaloid series (made by Hitachi Chemical Co., Ltd.).

A polyester based elastomer is obtained by polycondensing dicarboxylic acid or its derivative and a diol compound or its derivative. Specific examples of dicarboxylic acid include aromatic dicarboxylic acids such as terephthalic acid, isophthalic acid, and naphthalene dicarboxylic acid; aromatic dicarboxylic acids in which hydrogen atoms of these aromatic rings are substituted for a methyl group, an ethyl group, a phenyl group, and the like; aliphatic dicarboxylic acids having 2 to 20 carbon atoms such as adipic acid, sebacic acid, dodecane dicarboxylic acid, and the like; and alicyclic dicarboxylic acids such as cyclohexanedicarboxylic acid. One kind of these compounds or not less than two kinds can be used. Specific examples of the diol compound include sliphatic series diol and alicyclic diol such as ethylene glycol, 1,3-propanediol, 1,4-butanediol, 1,6-hexanediol, 1,10-decanediol,1,4-cyclohexanediol, bisphenol A, bis-(4-hydroxyphenyl)-methane, bis-(4-hydroxy-3-methylphenyl)-propane, and resorcin. One kind of these compounds can be used alone, or not less than two kinds can be used in combination.

A multiblock copolymer can also be used as the polyester based elastomer, the multiblock copolymer including an aromatic polyester (for example, polybutylene terephthalate) portion as the hard segment component and an aliphatic polyester (for example, polytetramethylene glycol) portion as the soft segment component. The polyester based elastomer has various grades depending on differences of kinds, a ratio, and the molecular weight of the hard segment and the soft segment.

Specific examples of the polyester based elastomer include Hytrel (made by E.I. du Pont de Nemours and Company-Toray Industries, Inc.), PELPRENE (made by Toyobo Co., Ltd.), and ESPEL (made by Hitachi Chemical Co., Ltd.).

A polyamide based elastomer is composed of the hard segment made of polyamides and the soft segment made of polyether or polyester, and is largely classified into two kinds, a polyether block amide type and a polyether ester block amide type. Examples of polyamide include polyamide 6, polyamide 11, and polyamide 12. Examples of polyether include polyoxyethylene, polyoxypropylene, and polytetramethylene glycol.

Specific examples of the polyamide based elastomer include UBE polyamide elastomer (made by Ube Industries, Ltd.), Daiamid (made by Daicel-Huels Ltd.), PEBAX (made by Toray Industries, Inc.), Grilon ELY (made by EMS-CHEMI Japan Ltd.), NOVAMID (made by Mitsubishi Chemical Corporation), and Grilax (made by Dainippon Ink & Chemicals, Inc.).

An acrylic elastomer is obtained by copolymerizing acrylic acid esters such as ethyl acrylate, butyl acrylate, methoxy ethyl acrylate, and ethoxyethyl acrylate with monomers having an epoxy group such as glycidyl methacrylate and allyl glycidyl ether and/or vinyl based monomers such as acrylonitrile and ethylene.

Examples of such an acrylic elastomer include acrylonitrile-butyl acrylate copolymers, acrylonitrile-butyl acrylate-ethylacrylate copolymers, and acrylonitrile-butyl acrylate-glycidyl methacrylate copolymers.

A silicone based elastomer mainly includes organopolysiloxane, and is classified into a polydimethylsiloxane based elastomer, a poly methylphenyl siloxane based elastomer, and a polydiphenyl siloxane based elastomer. Organopolysiloxane partially modified by a vinyl group, an alkoxy group, or the like may also be used.

Specific examples of such a silicone based elastomer include KE series (made by Shin-Etsu Chemical Co., Ltd.), SE series, CY series, and SH series (these are made by Dow Corning Toray Silicone Co., Ltd.).

Besides the elastomers mentioned above, rubber-modified epoxy resins can also be used. The rubber-modified epoxy resin is obtained by modifying a part of or all epoxy groups in a bisphenol F type epoxy resin, a bisphenol A type epoxy resin, a salicylaldehyde type epoxy resin, a phenol novolak type epoxy resin, or a cresol novolak type epoxy resin with a biterminal carboxylic-acid modified type butadiene acrylic nitrile rubber, a terminal amino modified silicone rubber, or the like.

The component (E) may also be a particulate elastomer (hereinafter, also referred to as "elastomer particulates").

The elastomer particulates means an elastomer dispersed in the state of particulates in the positive-type photosensitive resin product. Examples of the elastomer particulates include elastomers serving as an island in a sea island structure produced by phase separation in an incompatible system and elastomers serving as the so-called micro domain.

Preferable elastomer particulates are those (the so-called crosslinked particulates) obtained by copolymerizing a crosslinkable monomer having not less than two unsaturated bonds and other monomer of one kind or more selected so that Tg of the elastomer particulates may be not more than 20° C. The other monomer to be used is preferably a monomer obtained by copolymerizing a monomer having a functional group excluding a polymerizable group, for example, a functional group such as a carboxyl group, an epoxy group, an amino group, an isocyanate group, and a hydroxyl group.

Examples of the crosslinkable monomer include compounds having a plurality of polymerizable unsaturated groups such as divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate, and polypropylene glycol di(meth)acrylate. Among these, divinylbenzene is preferable.

The crosslinkable monomer used to produce the elastomer particulates is preferably 1 to 20 mass % to the total monomers used for copolymerization, and more preferably 2 to 10 mass %.

Examples of the other monomer include diene compounds such as butadiene, isoprene, dimethylbutadiene, chloroprene, and 1,3-pentadiene; unsaturated nitrile compounds such as (meth)acrylonitrile, α-chloro acrylonitrile, α-chloro methylacrylonitrile, α-methoxy acrylonitrile, α-ethoxy acrylonitrile, crotonic acid nitril, cinnamic acid nitril, dinitrile itaconate, dinitrile maleate, and dinitrile fumarate; unsaturated amides such as (meth)acrylamide, N,N'-methylenebis(meth)acrylamide, N,N'-ethylenebis(meth) acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonic acid amide, and cinnamic acid amide; (meth)acrylate esters such as methyl (meth)acrylate, ethyl (meth)acrylate, propyl (meth)acrylate, butyl (meth)acrylate, hexyl (meth)acrylate, lauryl (meth)acrylate, polyethyleneglycol (meth)acrylate, and polypropyleneglycol (meth)acrylate; aromatic vinyl compounds such as styrene, α-methylstyrene, o-methoxy styrene, p-hydroxystyrene, and p-isopropenyl phenol; epoxy (meth)acrylates obtained by a reaction of diglycidyl ether of bisphenol A, diglycidyl ether of glycol, and the like with (meth)acrylate, hydroxyalkyl (meth)acrylate, and the like; urethane (meth)acrylates obtained by a reaction of hydroxyalkyl (meth)acrylate with polyisocyanate; epoxy group containing unsaturated compounds such as glycidyl (meth)acrylate and (meth)allyl glycidyl ether; unsaturated acid compounds such as (meth)acrylate, itaconic acid, and succinic acid beta-(meth)acryloxyethyl, maleic acid beta-(meth)acryloxyethyl, phthalic acid beta-(meth)acryloxyethyl, and hexahydrophthalic acid beta-(meth)acryloxyethyl; amino group containing unsaturated compounds such as dimethylamino (meth)acrylate and diethylamino (meth)acrylate, amide group containing unsaturated compounds such as (meth)acrylamide and dimethyl (meth)acrylamide, and hydroxyl group containing unsaturated compounds such as hydroxyethyl (meth)acrylate, hydroxypropyl (meth)acrylate, and hydroxy butyl (meth)acrylate.

Among these, butadiene, isoprene, (meth)acrylonitrile, (meth)acrylate alkyl esters, styrene, p-hydroxystyrene, p-isopropenyl phenol, glycidyl (meth)acrylate, (meth)acrylate, and hydroxyalkyl (meth)acrylate are preferably used.

As such other monomer, at least one kind of diene compounds, specifically, butadiene is preferably used. Such a diene compound to be used is preferably 20 to 80 mass % to the total monomers used for copolymerization, and more preferably 30 to 70 mass %. The diene compound in such a ratio makes the elastomer particulates soft rubber-like particulates and, particularly, can prevent cracks (breaking) produced in the cured film obtained, thereby obtaining the cured film having excellent durability.

An average particle size of the elastomer particulates is preferably 30 to 500 nm, n ore preferably 40 to 200 nm, and still more preferably 50 to 120 nm. A method for controlling the particle size of the elastomer particulates is not limited in particular. For example, when the elastomer particulates are synthesized by emulsion polymerization, the number of micells in emulsion polymerization can be controlled by an amount of an emulsifier to be used, thereby to control the particle size.

A blending amount of such a component (E) is preferably 1 to 50 parts by mass based on 100 parts by mass of the component (A), and more preferably 5 to 30 parts by mass. A blending amount of the elastomer less than 1 part by mass is likely to reduce thermal shock resistance of the cured film obtained. A blending amount exceeding 50 parts by mass is likely to reduce resolution and thermal resistance of the cured film obtained, or to reduce compatibility and dispersibility with other components.

<Other Components>

In addition to the above-mentioned (A) to (D) components, the above-mentioned positive-type photosensitive resin composition may further contain components such as a compound that produces an acid by heating, a dissolution accelerator, a dissolution inhibitor, a coupling agent, and a surfactant or a leveling agent.

(A Compound that Produces an Acid by Heating)

Use of the compound that produces an acid by heating enables production of the acid at the time of heating the photosensitive resin film, and accelerates the reaction of the component (A) with the component (C), i.e., a thermal crosslinking reaction to improve thermal resistance of the cured film. The compound that produces the acid by heating also produces the acid by irradiation of the compound with light. Accordingly, the compound increases solubility of an exposed portion to an alkaline aqueous solution. This leads to a larger difference in solubility to an alkaline aqueous solution between an unexposed portion and an exposed portion to improve resolution.

Such a compound that produces an acid by heating preferably produces the acid by heating at 50 to 250° C., for example. Specific examples of the compound that produces the acid by heating include a salt formed of a strong acid and a base, such as onium salts, and imide sulfonates.

Examples of onium salts include diaryliodonium salts such as aryldiazonium salts and diphenyliodonium salts; di(alkyl aryl) iodonium salts such as di(t-butylphenyl) iodonium salts; trialkyl sulfonium salts as trimethyl sulfonium salts; dialkyl monoaryl sulfonium salts such as dimethyl phenyl sulfonium salts; diaryl monoalkyl iodonium salts such as diphenyl methyl sulfonium salts; and triarylsulfonium salts. Among these, preferable onium salts are: di(t-butylphenyl) iodonium salt with p-toluenesulfonic acid, di(t-butylphenyl) iodonium salt with trifluoromethanesulfonic acid, trimethyl sulfonium salt with trifluoromethanesulfonic acid, dimethylphenyl sulfonium salt with trifluoromethanesulfonic acid, diphenyl methylsulfonium salt with trifluoromethanesulfonic acid, di(t-butylphenyl) iodonium salt with nonafluorobutane sulfonic acid, diphenyliodonium salt with camphorsulfonic acid, diphenyliodonium salt of ethanesulfonic acid, dimethylphenyl sulfonium salt of benzenesulfonic acid, and diphenyl methylsulfonium salt of toluenesulfonic acid.

As a salt formed from a strong acid and a base, other than the onium salts mentioned above, salts formed of the following strong acid and base, for example, pyridinium salt can be also used. Examples of strong acids include aryl sulfone acids such as p-toluenesulfonic acid and benzenesulfonic acid, perfluoroalkyl sulfonic acids such as camphorsulfonic acid, trifluoromethanesulfonic acid, and nonafluorobutane sulfonic acid, and alkyl sulfonic acids such as methanesulfonic acid, ethanesulfonic acid, and butanesulfonic acid. Examples of bases include alkyl pyridines such as pyridine and 2,4,6-trimethylpyridine, N-alkyl pyridines such as 2-chloro-N-methylpyridine, and N-alkyl pyridine halides.

As imide sulfonates, naphthoyl imide sulfonate and phthalimide sulfonate can be used, for example.

As the compound that produces an acid by heating, other than above-mentioned compounds, a compound having a structure represented by the following general formula (III) and a compound having a sulfonamide structure represented by the following general formula (IV) can also be used.

$$R^5R^6C=N-O-SO_2-R^7 \quad (III)$$

$$-NH-SO_2-R^8 \quad (IV)$$

In the general formula (III), $R^5$ is a cyano group, for example, and $R^6$ is a methoxypheny group or a phenyl group, for example. $R^7$ is an aryl group such as a p-methylphenyl group and a phenyl group, an alkyl group such as a methyl group, an ethyl group, and an isopropyl group, or a perfluoroalkyl group such as a trifluoromethyl group and a nonafluorobutyl group, for example.

In the general formula (IV), $R^8$ is an alkyl group such as a methyl group, an ethyl group, and a propyl group, an aryl group such as a methylphenyl group and a phenyl group, or a perfluoroalkyl group such as a trifluoromethyl group and a nonafluorobutyl, for example. Examples of a group bonded to an N atom in the sulfonamide structure represented by the general formula (IV) include 2,2'-bis(4-hydroxyphenyl) hexafluoropropane, 2,2'-bis(4-hydroxyphenyl)propane, and di(4-hydroxyphenyl)ether.

A blending amount of the compound that produces an acid by heating is preferably 0.1 to 30 parts by mass based on 100 parts by mass of the component (A), and more preferably 0.2 to 20 parts by mass, and still more preferably 0.5 to 10 parts by mass.

(A Dissolution Accelerator)

By blending a dissolution accelerator with the above-mentioned positive-type photosensitive resin composition, a dissolution rate of an exposed portion at the time of developing the exposed portion by an alkaline aqueous solution can be increased to improve sensitivity and resolution. Conventionally known dissolution accelerators can be used as the dissolution accelerator. Specific examples thereof include compounds having a carboxyl group, a sulfonic acid, and a sulfonamide group.

A blending amount in a case of blending such a dissolution accelerator can be determined by the dissolution rate to an alkaline aqueous solution, and can be 0.01 to 30 parts by mass based on 100 parts by mass of the component (A), for example.

(A Dissolution Inhibitor)

A dissolution inhibitor is a compound that obstructs solubility of the component (A) to an alkaline aqueous solution, and is used in order to control a residual film thickness, the developing time, and contrast. Specific examples thereof include diphenyliodonium nitrate, bis(p-tert-butylphenyl)iodonium nitrate, diphenyliodonium bromide, diphenyliodonium chloride, and diphenyliodonium iodide. From the viewpoint of tolerance of sensitivity and a developing time, a blending amount in a case of blending the dissolution inhibitor is preferably 0.01 to 20 parts by mass based on 100 parts by mass of the component (A), and more preferably 0.01 to 15 parts by mass, and most preferably 0.05 to 10 parts by mass.

(A Coupling Agent)

Blending of a coupling agent with the above-mentioned positive-type photosensitive resin composition can increase adhesiveness of the formed cured film to the substrate. Examples of the coupling agent include organic silane compounds and aluminum chelate compounds.

Examples of organic silane compounds include vinyltriethoxysilane, γ-glycidoxypropyltriethoxysilane, γ-methacryloxypropyltrimethoxysilane, ureapropyl triethoxysilane, methylphenyl silanediol, ethylphenyl silanediol, n-propylphenyl silanediol, isopropylphenyl silanediol, n-butylphenyl silanediol, isobutylphenyl silane diol, tert-butylphenyl silanediol, diphenyl silanediol, ethylmethylphenyl silanol, n-propylmethylphenyl silanol, isopropylmethylphenyl silanol, n-butylmethylphenyl silanol, isobutylmethylphenyl silanol, tert-butylmethylphenyl silanol, ethyl-n-propylphenyl silanol, ethylisopropylphenyl silanol, n-butylethylphenyl silanol, isobutylethylphenyl silanol, tert-butylethylphenyl silanol, methyldiphenyl silanol, ethyldiphenyl silanol, n-propyldiphenyl silanol, isopropyldiphenyl silanol, n-butyldiphenyl silanol, isobutyldiphenyl silanol, tert-butyldiphenyl silanol, phenyl silanetriol, 1,4-bis(trihydroxysilyl) benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene.

A blending amount in a case of using the coupling agent is preferably 0.1 to 20 parts by mass based on 100 parts by mass of the component (A), and more preferably 0.5 to 10 parts by mass.

(A Surfactant or a Leveling Agent)

Blending of a surfactant or a leveling agent with the above-mentioned positive-type photosensitive resin composition can improve coating properties, for example, prevention of striation (unevenness of thickness), or can improve development properties. Examples of such a surfactant or a leveling agent include polyoxyethylene lauryl ether, polyoxyethylene stearyl ether, polyoxyethylene oleyl ether, and polyoxyethylene octylphenol ether. Examples of commercial products include Megafax F171, F173, and R-08 (made by Dainippon Ink & Chemicals, Inc., trade name), Fluorad FC430, FC431 (Sumitomo 3M Limited, trade name), and Organosiloxane Polymer KP341, KBM303, KBM403, KBM803 (made by Shin-Etsu Chemical Co., Ltd., trade name).

A blending amount of the total in a case of using the surfactant or the leveling agent is preferably 0.001 to 5 parts by mass based on 100 parts by mass of the component (A), and more preferably 0.01 to 3 parts by mass.

The positive-type photosensitive resin composition mentioned above can be developed using an alkaline aqueous solution such as tetramethylammonium hydroxide (TMAH). Use of the positive-type photosensitive resin composition can form a resist pattern having sufficiently high sensitivity and resolution, and good adhesion and thermal shock resistance.

[A Method for Production of a Resist Pattern]

Next, a method for production of a resist pattern will be described. A method for production of a resist pattern according to the present invention includes a step of exposing a photosensitive resin film made of the above-mentioned positive-type photosensitive resin composition, a step of developing the photosensitive resin film exposed by an alkaline aqueous solution to pattern the photosensitive resin film, and a step of heating the patterned photosensitive resin film. Hereinafter, each step will be described.

<An Applying and Drying (Film Forming) Step>

First, the above-mentioned positive-type photosensitive resin composition is applied onto a supporting substrate, and dried to form a photosensitive resin film. At this step, first, by spin coating using a spinner or the like, the above-mentioned positive-type photosensitive resin composition is applied onto a support substrate formed of a glass substrate, a semiconductor, a metal oxide insulator (for example, $TiO_2$, $SiO_2$, and the like), silicon nitrides, or the like to form a coating. The supporting substrate having this formed coating is dried using a hot plate, an oven, and the like. Thereby, the photosensitive resin film is formed on the support substrate.

<An Exposing Step>

Next, at an exposing step, the photosensitive resin film formed on the support substrate is irradiated through a mask with active light such as an ultraviolet ray, a visible ray, and radiation. In the above-mentioned positive-type photosensitive resin composition, the component (A) has high transparency to an i line, and can be suitably used to be irradiated with the i line. Post-exposure baking (PEB) can also be performed when necessary after exposing the photosensitive resin film. A temperature of post-exposure baking is preferably 70° C. to 140° C., and a time of post-exposure baking is preferably 1 minute to 5 minutes.

<A Developing Step>

At a developing step, an exposed portion of the photosensitive resin film is removed by a developer after the exposing step to pattern the photosensitive resin film. As the developer, alkaline aqueous solutions such as sodium hydroxide, potassium hydroxide, sodium silicate, ammonia, ethylamine, diethylamine, triethylamine, triethanolamine, and tetramethylammonium hydroxide (TMAH), are used suitably, for example. A base concentration in these aqueous solutions is preferably 0.1 to 10 mass %. Alcohols and a surfactant can also be added to the above-mentioned developer and used. Each of these can be added to 100 parts by mass of the developer preferably within the range of 0.01 to 10 parts by mass and more preferably within the range of 0.1 to 5 parts by mass.

<A Heat-Treating Step>

Next, at a heat-treating step, the patterned photosensitive resin film can be heat-treated to form a resist pattern formed of the heated photosensitive resin film. From the viewpoint of sufficient prevention of damages to an electronic device caused by heat, a heating temperature at the heat-treating step is desirably not more than 250° C., more desirably not more than 225° C., and more desirably 140 to 200° C.

Heat treatment can be performed using an oven such as a quartz tube furnace, a hot plate, a rapid thermal annealing, a vertical diffusion furnace, an infrared curing oven, an electron beam curing oven, and a microwave curing oven, for example. Heat treatment in the air or under an inert atmosphere of nitrogen or the like can also be selected. However, heat treatment under nitrogen can prevent oxidization of the pattern, and is desirable. The range of the above-mentioned desirable heating temperature is lower than a conventional heating temperature, and can reduce damages to the support substrate and the electronic device. Accordingly, the electronic device can be manufactured at a high yield by using the method for production of a resist pattern according to the present invention. Energy saving in the process is also attained. Further, according to the positive-type photosensitive resin composition according to the present invention, volume shrinkage (cure shrinkage) of a photosensitive polyimide and the like at the heat-treating step is small, and can prevent reduced dimensional accuracy.

A heating time at the heat-treating step may be a time enough to cure the positive-type photosensitive resin composition, and is preferably not more than 5 hours in general in consideration of working efficiency.

Heat treatment can also be performed using a microwave curing apparatus or a frequency variable microwave curing apparatus other than above-mentioned ovens. Use of these apparatuses allows effective heating of only the photosensitive resin film while the temperature of the substrate and the electronic device is kept at a temperature of not more than 200° C.

In the frequency variable microwave curing apparatus, irradiation with a microwave in a pulse form is performed while the frequency of the microwave is changed. Accordingly, the frequency variable microwave curing apparatus can prevent a standing wave, can heat a substrate surface uniformly, and is preferable. In the case of the substrate including a metal wiring as an electronic component described later, the frequency variable microwave curing apparatus is also preferable because irradiation of the heated body with the microwave in a pulse form while the frequency of the microwave is changed can prevent occurrence of discharge from a metal or the like and protect the electronic component from breakage. Heating using a frequency variable microwave is also preferable because the physical properties of the cured film do not deteriorate at a curing temperature lower than that in a case where an oven is used (see J. Photopolym. Sci. Technol., 18, 327-332 (2005)).

The frequency of the frequency variable microwave is within the range of 0.5 to 20 GHz. Practically, the frequency thereof is preferably within the range of 1 to 10 GHz, and more preferably within the range of 2 to 9 GHz. The frequency of the microwave used for irradiation is desirably changed continuously. In practice, however, irradiation of a heated body with the microwave is performed by step-wise change of the frequency of the microwave. At that time, the standing wave, discharge from a metal, and the like are more unlikely to occur as an irradiation time with a microwave at a single frequency is shorter as possible. Accordingly, the irradiation time is preferably not more than millisecond, and particularly preferably not more than 100 microseconds.

Although an output of the microwave used for irradiation varies depending on a size of the apparatus or an amount of a heated body, the output is within the range of 10 to 2000 W in general. Practically, the output is preferably 100 to 1000 W, more preferably 100 to 700 W, and most preferably 100 to 500 W. At an output of not more than 10 W, it is difficult to heat the heated body for a short time. At an output of not less than 2000 W, a temperature is likely to increase rapidly. Accordingly, the both cases are not preferable.

Preferably, the microwave is switched ON/OFF in a pulse form for irradiation. Irradiation of a heated body with the microwave in a pulse form is preferable because this can keep a set heating temperature, and can avoid damages to the cured film or the base material. While an irradiation time with the microwave in a pulse form at one time varies depending on conditions, the time is preferably not more than 10 seconds in general.

According to the method for production of the resist pattern mentioned above, a resist pattern having sufficiently high sensitivity and resolution and good thermal resistance is obtained.

[A Manufacturing Step of a Semiconductor Device]

Next, as an example of the method for production of a resist pattern according to the present invention, a manufacturing step of a semiconductor device will be described on the basis of the drawings. FIG. 1 to FIG. 5 are schematic sectional views showing one embodiment of a manufacturing step of a semiconductor device having a multi-layered interconnection structure.

First, a structure 100 shown in FIG. 1 is prepared. The structure 100 includes a semiconductor substrate 1, such as an Si substrate, having a circuit element; a protective film 2, such as a silicon oxide film, that has a predetermined pattern in which the circuit element is exposed and covers the semiconductor substrate 1; a first conductive layer 3 formed on the exposed circuit element; and an interlayer insulation film 4 made of a polyimide resin or the like and formed by a spin coat method or the like on the protective film 2 and the first conductive layer 3.

Figure 2:
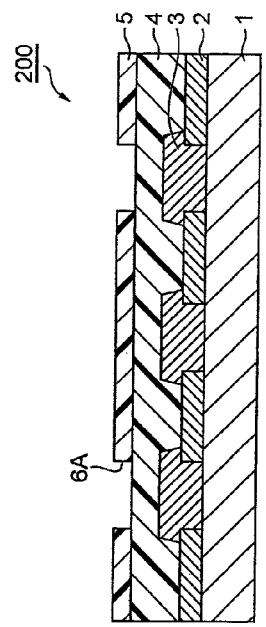
FIG. 2 is a schematic sectional view showing one embodiment of a step of producing a semiconductor device.
Figure 3:
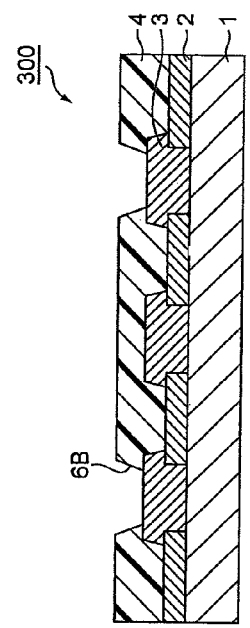
FIG. 3 is a schematic sectional view showing one embodiment of a step of producing a semiconductor device.

Next, a photosensitive resin layer 5 having a window portion 6A is formed on the interlayer insulation film 4 to obtain a structure 200 shown in FIG. 2. The photosensitive resin layer 5 is formed by applying a photosensitive resin such as chlorinated rubber based photosensitive resins, phenol novolak based photosensitive resins, polyhydroxy styrene based photosensitive resins, and polyacrylic ester based photosensitive resins by a spin coat method, for example. The window portion 6A is formed using a known photolithography technique so that a predetermined portion of the interlayer insulation film 4 may be exposed.

The interlayer insulation film 4 is etched to form a window portion 6B. Subsequently, the photosensitive resin layer 5 is removed to obtain a structure 300 shown in FIG. 3. A dry etching means using a gas such as oxygen and carbon tetrafluoride can be used for etching of the interlayer insulation film 4. The portion of the interlayer insulation film 4 corresponding to the window portion 6A is selectively removed by this etching to obtain the interlayer insulation film 4 having the window portion 6B provided so that the first conductive layer 3 may be exposed. Next, the photosensitive resin layer 5 is removed using an etching solution that corrodes only the photosensitive resin layer 5 without corroding the first conductive layer 3 exposed from the window portion 6B.

Figure 4:
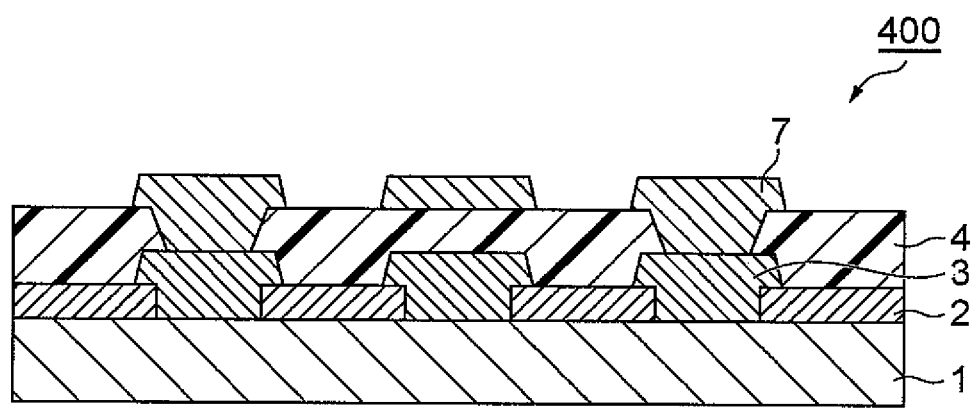
FIG. 4 is a schematic sectional view showing one embodiment of a step of producing a semiconductor device.

Further, the second conductive layer 7 is formed in a portion corresponding to the window portion 6B to obtain a structure 400 shown in FIG. 4. A known photolithography technique can be used for formation of the second conductive layer 7. Thereby, the second conductive layer 7 is electrically connected to the first conductive layer 3.

Figure 5:
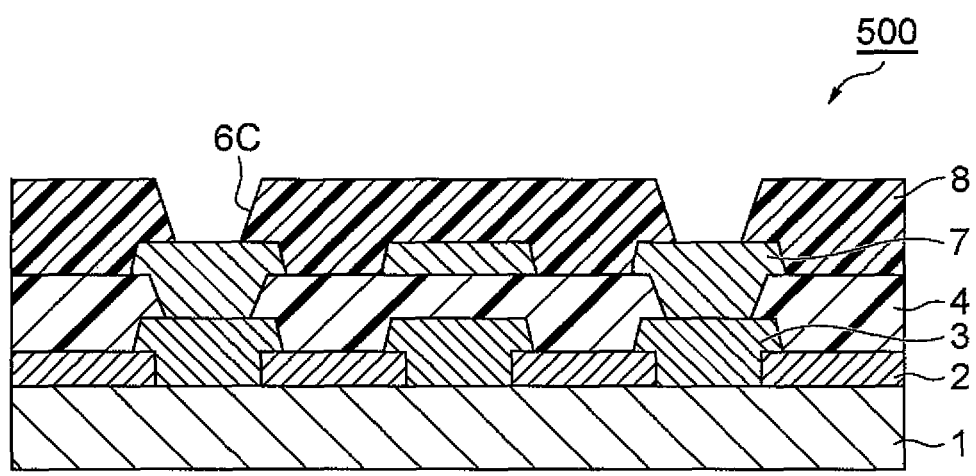
FIG. 5 is a schematic sectional view showing one embodiment of a step of producing a semiconductor device.

Finally, a surface protection layer 8 is formed on the interlayer insulation film 4 and the second conductive layer 7 to obtain a semiconductor device 500 shown in FIG. 5. In this embodiment, the surface protection layer 8 is formed as follows. First, the positive-type photosensitive resin composition according to the above-mentioned embodiment is applied by a spin coat method onto the interlayer insulation film 4 and the second conductive layer 7, and dried to form a photosensitive resin film. Next, a predetermined portion is irradiated with light through a mask having a pattern corresponding to a window portion 6C. Subsequently, the predetermined portion is developed by an alkaline aqueous solution to pattern the photosensitive resin film. Subsequently, the photosensitive resin film is cured by heating to form a film as the surface protection layer 8. This surface protection layer 8 protects the first conductive layer 3 and the second conductive layer 7 from stress from an outside, α rays, and the like. The semiconductor device 500 obtained has high reliability.

While a method for production of a semiconductor device having a two-layered wiring structure has been shown in the above-mentioned embodiment, in formation of a multi-layered interconnection structure of not less than three layers, the above-mentioned steps can be repeated to form each layer. Namely, it is possible to form a multi-layered pattern by repeating each step of forming the interlayer insulation film 4, and each step of forming the surface protection layer 8. In the above-mentioned embodiment, it is possible to form not only the surface protection layer 8 but also the interlayer insulation film 4 using the positive-type photosensitive resin composition according to the present invention.

[An Electronic Component]

Next, an electronic component of the present invention will be described. The electronic component of the present invention has the resist pattern formed by the above-mentioned method for production as the interlayer insulation layer or the surface protection layer. Specifically, the above-mentioned resist pattern can be used as a surface protection layer and an interlayer insulation layer of a semiconductor device, an interlayer insulation layer of a multi-layered interconnection board, and the like. The electronic component of the present invention is not limited in particular except that the electronic component has the surface protection layer and the interlayer insulation layer formed using the above-mentioned positive-type photosensitive resin composition, and can have various structures.

Figure 6:
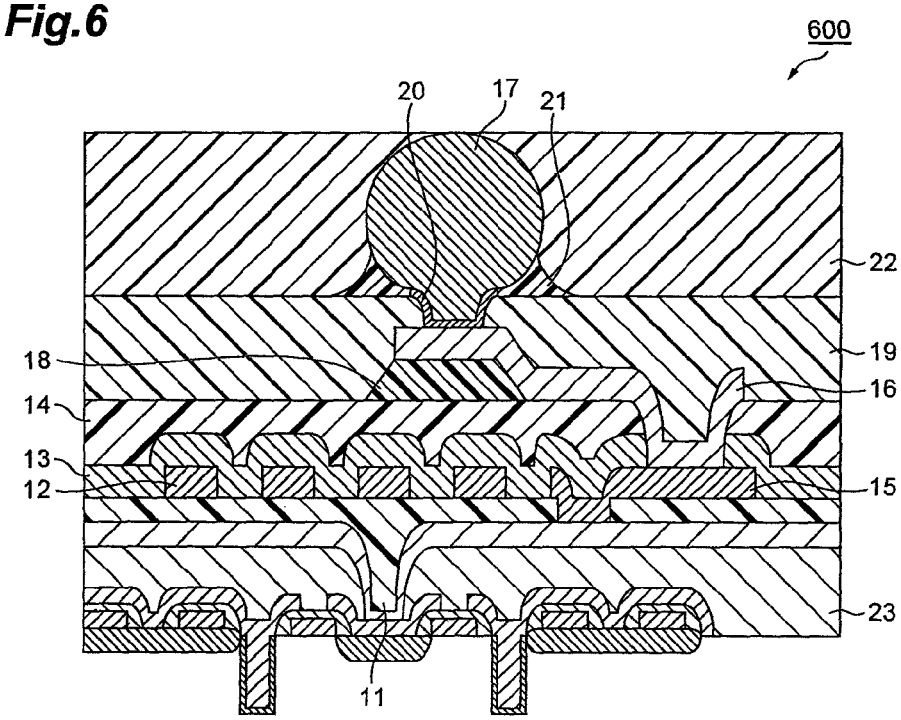
FIG. 6 is a schematic sectional view showing one embodiment of an electronic component (semiconductor device)
Figure 7:
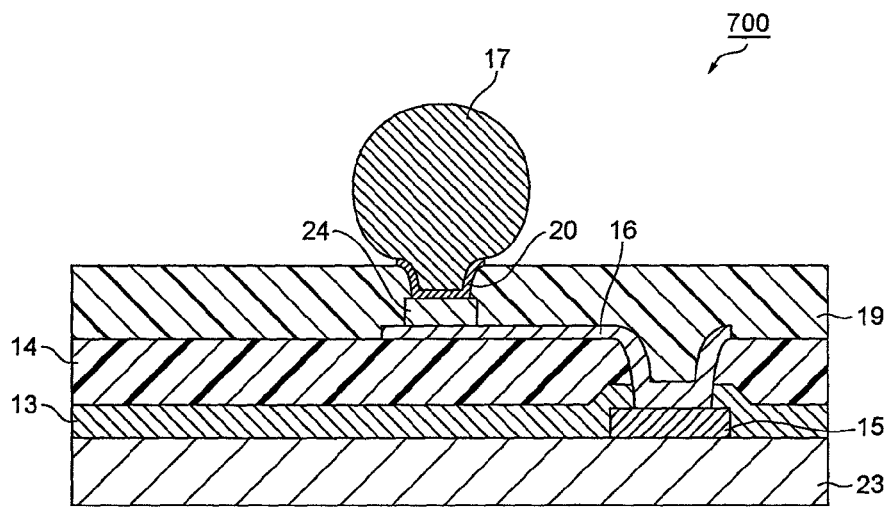
FIG. 7 is a schematic sectional view showing one embodiment of an electronic component (semiconductor device).

Moreover, the above-mentioned positive-type photosensitive resin composition has excellent stress relief properties, adhesiveness, and the like, and can be used also as various kinds of structural materials in packages of recently developed various structures. FIG. 6 and FIG. 7 show a cross sectional structure of such a semiconductor device as an example.

FIG. 6 is a schematic sectional view showing a wiring structure as one embodiment of the semiconductor device. The semiconductor device 600 shown in FIG. 6 includes a silicon chip 23; an interlayer insulation film 11 provided on one surface side of the silicon chip 23; an Al wiring layer 12 formed on the interlayer insulation film 11 and having a pattern including a pad portion 15; an insulating layer 13 (for example, P—SiN layer) and a surface protection layer 14 sequentially deposited on the interlayer insulation film 11 and the Al wiring layer 12 while an opening is formed on the pad portion 15; a core 18 having an island shape arranged on the surface protection layer 14 and in the vicinity of the opening; and a redistribution layer 16 that extends on the surface protection layer 14 so as to contact the pad portion 15 within the opening of the insulating layer 13 and the surface protection layer 14, and contact a surface of the surface protection layer 14 on a side opposite to the core 18. The semiconductor device 600 further includes a cover coat layer 19 formed to cover the surface protection layer 14, the core 18, and the redistribution layer 16, and having an opening formed in a portion of the redistribution layer 16 on the core 18; a conductive ball 17 connected with the redistribution layer 16 through a barrier metal 20; a collar 21 holding the conductive ball; and an underfill 22 provided on the cover coat layer 19 around the conductive ball 17. The conductive ball 17 is used as an external connection terminal, and is formed of solder, gold, and the like. The underfill 22 is provided in order to relieve stress when the semiconductor device 600 is mounted.

FIG. 7 is a schematic sectional view showing a wiring structure as one embodiment of a semiconductor device. In the semiconductor device 700 of FIG. 7, an Al wiring layer (not shown) and a pad portion 15 of the Al wiring layer are formed on the silicon chip 23. An insulating layer 13 is formed on the upper portion of the Al wiring layer (not shown) and a pad portion 15 of the Al wiring layer, and a surface protection layer 14 of the element is further formed. A redistribution layer 16 is formed on the pad portion 15. This redistribution layer 16 extends to an upper portion of a connection portion 24 with a conductive ball 17. A cover coat layer 19 is formed on the surface protection layer 14. The redistribution layer 16 is connected to the conductive ball 17 though a barrier metal 20.

In the semiconductor devices of FIG. 6 and FIG. 7, the above-mentioned positive-type photosensitive resin composition can be used as a material for forming not only the layer insulation film 11 and the surface protection layer 14 but also the cover coat layer 19, the core 18, the collar 21, and the underfill 22. A cured body using the above-mentioned positive-type photosensitive resin composition has excellent adhesiveness to the Al wiring layer 12, a metal layer of the redistribution layer 16, an encapsulant, and the like, and a high stress relief effect. Accordingly, a semiconductor device in which this cured body is used for the surface protection layer 14, the cover coat layer 19, the core 18, the collar 21 such as solder, the underfill 12 used in a flip chip, and the like, has very high reliability.

The positive-type photosensitive resin composition according to the present invention is particularly suitably used for the surface protection layer 14 and/or the cover coat layer 19 of the semiconductor device having the redistribution layer 16 in FIG. 6 and FIG. 7.

A thickness of the surface protection layer or that of the cover coat layer is preferably 3 to 20 μm, and more preferably 5 to 15 μm.

As mentioned above, use of the above-mentioned positive-type photosensitive resin composition allows curing by heating at a low temperature of not more than 200° C. in the above-mentioned heat-treating step, in which a temperature of not less than 300° C. is conventionally needed. In the heat-treating step, a heating temperature is preferably 100° C. to 200° C., and more preferably 150° C. to 200° C. The positive-type photosensitive resin composition according to the present invention can also prevent reduction in dimensional accuracy because of small volume shrinkage (cure shrinkage) of a photosensitive polyimide and the like at the heat-treating step. A cured film of the positive-type photosensitive resin composition has a high glass transition temperature. Accordingly, the cured film provides a surface protection layer or a cover coat layer having excellent thermal resistance. As a result, an electronic component such as a semiconductor device having high reliability can be obtained at a high yield.

While the suitable embodiments according to the present invention have been described as mentioned above, the present invention will not be limited to those.

EXAMPLES

While the present invention will be described in detail on the basis of Examples below, the present invention will not be limited to these.

Preparation of the Component (A)

Synthesis Example 1: Synthesis of a Phenol Resin (A1) Modified by a Compound (Drying Oil) Having a Unsaturated Hydrocarbon Group Having 4 to 100 Carbon Atoms 100 parts by mass of a phenol derivative obtained by mixing m-cresol and p-cresol in a mass ratio of 60:40 was mixed with 11 parts by mass of twig oil and 0.01 parts by mass of p-toluenesulfonic acid, and stirred at 120° C. for 2 hours to obtain a compound a of a drying oil modified phenol derivative. Next, 117 g of the above-mentioned compound a, 16.3 g of paraformaldehyde, and 1.1 g of oxalic acid were mixed, and reacted by stirring the mixture for 3 hours at 90° C. Next, a temperature of the reaction mixture was raised to 120° C., and the reaction mixture was stirred under reduced pressure for 3 hours. Subsequently, the reaction mixture was cooled to room temperature under atmospheric pressure to obtain a drying oil modified phenol resin (A1) as the reaction product. A weight average molecular weight of the A1 of 13,000 was determined by standard polystyrene conversion of a GPC method.

Synthesis Example 2: Synthesis of a Phenol Resin (A2) Modified with a Compound (Drying Oil) Having an Unsaturated Hydrocarbon Group Having 4 to 100 Carbon Atoms 100 parts by mass of phenol, 11 parts by mass of linseed oil, and 0.1 parts by mass of trifluoromethanesulfonic acid were mixed, and stirred at 120° C. for 2 hours to obtain a compound b of a drying oil modified phenol derivative. Then, 101 g of the above-mentioned compound b, 16.3 g of paraformaldehyde, and 1.0 g of oxalic acid were mixed, and reacted by stirring the mixture for 3 hours at 90° C. Next, a temperature of the reaction mixture was raised to 120° C., and the reaction mixture was stirred under reduced pressure for 3 hours. Subsequently, the reaction mixture was cooled to room temperature under atmospheric pressure to obtain a drying oil modified phenol resin (A2) as the reaction product. A weight average molecular weight of the A2 of 10,000 was determined by standard polystyrene conversion of the GPC method.

Synthesis Example 3: Synthesis of a Phenol Resin (A3) Modified by a Compound (Drying Oil) Having an Unsaturated Hydrocarbon Group Having 4 to 100 Carbon Atoms 100 parts by mass of phenol, 43 parts by mass of linseed oil, and 0.1 parts by mass of trifluoromethanesulfonic acid were mixed, and stirred at 120° C. for 2 hours to obtain a compound c of a drying oil modified phenol derivative. Then, 130 g of the above-mentioned compound c, 16.3 g of paraformaldehyde, and 1.0 g of oxalic acid were mixed, and reacted by stirring the mixture for 3 hours at 90° C. Next, a temperature of the reaction mixture was raised to 120° C., and the reaction mixture was stirred under reduced pressure for 3 hours. Subsequently, the reaction mixture was cooled to room temperature under atmospheric pressure to obtain a drying oil modified phenol resin (A3) as the reaction product. A weight average molecular weight of the A3 of 25,000 was determined by standard polystyrene conversion of the GPC method.

Synthesis Example 4: Synthesis of a Phenol Resin (A4) Modified by a Compound (Drying Oil) Having an Unsaturated Hydrocarbon Group Having 4 to 100 Carbon Atoms 130 g of the above-mentioned compound c, 16.3 g of paraformaldehyde, and 1.0 g of oxalic acid were mixed, and reacted by stirring the mixture for 3 hours at 90° C. Next, a temperature of the reaction mixture was raised to 120° C., and the reaction mixture was stirred under reduced pressure for 3 hours. 29 g of succinic anhydride and 0.3 g of triethylamine were added to the reaction mixture, and stirred at 100° C. under atmospheric pressure for 1 hour. The reaction mixture was cooled to room temperature to obtain a drying oil modified phenol resin (A4) as the reaction product. A weight average molecular weight of the A4 of 28,000 was determined by standard polystyrene conversion of the GPC method.

Synthesis Example 5: Synthesis of a Phenol Resin (A5) Modified by a Compound (Drying Oil) Having an Unsaturated Hydrocarbon Group Having 4 to 100 Carbon Atoms 100 g of a cresol novolak resin (m-cresol/p-cresol (mole ratio)=60/40, weight average molecular weight: 7000, made by Asahi Organic Chemical Industry Co., Ltd., trade name "EP4050G"), 30 g of linseed oil, and 0.1 g of trifluoromethanesulfonic acid were mixed, and reacted by stirring the mixture for 2 hours at 120° C. The reaction mixture was cooled to room temperature to obtain a drying oil modified phenol resin (A5) as the reaction product. A weight average molecular weight of the A5 of 8,000 was determined by standard polystyrene conversion of the GPC method.

<Preparation of a Positive-Type Photosensitive Resin Composition>

The above-mentioned phenol resins A1 to A5 modified by a compound (drying oil) having an unsaturated hydrocarbon group having 4 to 100 carbon atoms were prepared as the component (A).

B1 below was prepared as the component (B).
B1: 1-naphthoquinone-2-diazido-5-sulfonate with 1,1-bis(4-hydroxyphenyl)-1-[4-{1-(4-hydroxyphenyl)-1-methylethyl}phenyl]ethane (esterification rate of approximately 90%, made by AZ Electronic Materials Kabushiki Kaisha, trade name "TPPA528")

As the component (C), C1 and C2 below were prepared.
C1: 2,2-bis[3,5-bis(hydroxymethyl)-4-hydroxyphenyl]propane (made by Honshu Chemical Industry Co., Ltd., trade name "TML-BPA")
C2: hexakis(methoxymethyl)melamine (made by Sanwa Chemical Co., Ltd., trade name "NIKALAC MW-30HM")

As the component (D), D1 and D2 below were prepared.
D1: γ-butyrolactone/propylene glycol monomethyl ether acetate=90/10 (mass ratio)
D2: ethyl lactate As the component (E), E1 and E2 below were prepared.
E1: butadiene styrene methacrylate copolymer (made by Rohm and Hass Company, trade name "Palaloid EXL2655")
E2: liquefied butadiene acrylonitrile copolymer (made by Ube Industries, Ltd., trade name "HYCAR CTBN-1300")

Examples 1 to 9

The (A) to (E) components were blended in a predetermined ratio shown in Table 1, and a 50% methanol solution of urea propyl triethoxysilane of 2 parts by mass was further blended as a coupling agent (bonding assistant). This solution was filtered under pressure using a Teflon (registered trademark) filter having a pore size of 3 μm to prepare solutions (M1 to M9) of the positive-type photosensitive resin composition according to Examples 1 to 9.

Comparative Example 1

Instead of the (A1) to (A5), an (a) phenol resin (made by Asahi Organic Chemical Industry Co., Ltd., trade name "EP4050G") not modified by a compound (drying oil) having an unsaturated hydrocarbon group having 4 to 100 carbon atoms was prepared, and blended with the (B) to (D) components in a predetermined ratio shown in Table 1. Further, a 50% methanol solution of urea propyl triethoxysilane of 2 parts by mass was blended as a coupling agent (bonding assistant). This solution was filtered under pressure using a Teflon (registered trademark) filter having a pore size of 3 μm to prepare a solution (M10) of the positive-type photosensitive resin composition according to Comparative Example 1.

TABLE 1

|  | Positive-type photosensitive resin composition | Component (A) | Component (B) | Component (C) | Component (D) | Component (E) |
| --- | --- | --- | --- | --- | --- | --- |
| Example 1 | M1 | A1 (100) | B1 (15) | C1 (15) | D1 (180) | None |
| Example 2 | M2 | A1 (100) | B1 (15) | C2 (15) | D2 (180) | E1 (10) |
| Example 3 | M3 | A2 (100) | B1 (15) | C2 (15) | D2 (180) | None |
| Example 4 | M4 | A2 (100) | B1 (15) | C1 (15) | D1 (180) | E2 (10) |
| Example 5 | M5 | A3 (100) | B1 (15) | C2 (15) | D2 (180) | None |
| Example 6 | M6 | A3 (100) | B1 (15) | C1 (15) | D1 (180) | None |
| Example 7 | M7 | A4 (100) | B1 (15) | C1 (15) | D1 (180) | None |
| Example 8 | M8 | A4 (100) | B1 (15) | C2 (15) | D2 (180) | None |
| Example 9 | M9 | A5 (100) | B1 (15) | C1 (15) | D1 (180) | E1 (10) |
| Comparative Example 1 | M10 | α (100) | B1 (15) | C1 (15) | D1 (180) | None |

A value within ( ) is shown in parts by mass.

<Evaluation of the Positive-Type Photosensitive Resin Composition>

[Photosensitive Properties]

The solutions (M1 to M10) of the positive-type photosensitive resin composition obtained in Examples 1 to 9 and Comparative Example 1 were applied onto a silicon substrate by spin coating, and heated for 5 minutes at 100° C. to form a coating having a thickness of 11 to 13 μm. Next, reduced projection exposure by an i line (365 nm) was performed through a mask using an i line stepper (made by Canon Inc., trade name "FPA-3000iW"). After exposure, development was performed by a 2.38% aqueous solution of tetramethylammonium hydroxide (TMAH), and development was performed so that a residual thickness of the film might be approximately 80 to 95% of an initial thickness thereof. Subsequently, the substrate was rinsed by water, and the minimum exposure amount necessary for pattern formation and a size of the minimum square hole pattern opened were determined. The minimum exposure amount was evaluated as sensitivity and the size of the minimum square hole pattern opened was evaluated as resolution. Table 2 shows the result.

TABLE 2

| | Positive-type photosensitive resin composition | Rate of remaining film (%) | Sensitivity (mJ/cm$^2$) | Resolution (μm) |
|---|---|---|---|---|
| Example 1 | M1 | 93 | 350 | 8 |
| Example 2 | M2 | 94 | 380 | 8 |
| Example 3 | M3 | 90 | 320 | 8 |
| Example 4 | M4 | 88 | 300 | 5 |
| Example 5 | M5 | 95 | 400 | 10 |
| Example 6 | M6 | 95 | 380 | 8 |
| Example 7 | M7 | 83 | 250 | 5 |
| Example 8 | M8 | 85 | 280 | 5 |
| Example 9 | M9 | 92 | 350 | 8 |
| Comparative Example 1 | M10 | 93 | 300 | 5 |

[Patterning of a San: Pie for Physical Properties Measurement of a Cured Film]

The solutions (M1 to M10) of the positive-type photosensitive resin composition obtained in Examples 1 to 9 and Comparative Example 1 were applied onto a silicon substrate by spin coating, and heated at 100° C. for 5 minutes to form a coating having a thickness of approximately 12 to 14 μm. Subsequently, the coatings of the resins M1 to M10 were exposed at a full wave length through a mask using a proximity exposure machine (made by Canon Inc., trade name "PLA-600FA"). After exposure, development was performed by a 2.38% aqueous solution of TMAH to obtain a rectangular pattern having a width of 10 mm. Subsequently, the coating was heat-treated (cured) by a method (i) or (ii) below to obtain a cured film having a thickness of approximately 10 μm. Table 3 shows curing conditions and a shrinkage ratio of a thickness before and after curing ([1–(thickness after curing/thickness before curing)]×100) [%].

(i) Using a vertical diffusion furnace (micro-TF made by Koyo Thermo Systems Co., Ltd.), the coating was heat-treated in nitrogen for 2 hours (for temperature rise time of 1.5 hours) at a temperature of 175° C.

(ii) using a frequency variable type microwave curing oven (made by Lambda Technologies, Inc., trade name "Microcure 2100"), the coating was heat-treated for 2 hours (for a temperature rise time of 5 minutes) at a microwave output of 450 W, at a microwave frequency of 5.9 to 7.0 GHz, and at a temperature of 165° C.

[Physical Properties of the Cured Film]

The cured film having a thickness of approximately 10 μm obtained by the above-mentioned "patterning of the sample for physical properties measurement of the cured film" was peeled off from the silicon substrate, and a glass transition temperature (Tg) of the cured film peeled off was measured by "TMA/SS600" made by Seiko Instruments Inc. A width of the sample is 2 mm, a thickness thereof is 9 to 11 μm, and an interval between chucks is 10 mm. A load is 10 g, and a temperature raising rate is 5° C./min. An average elongation at break (EL) of the peeled off layer was measured by an "Autograph AGS-H 100N" made by Shimadzu Corp. A width of the sample is 10 mm, a thickness thereof is 9 to 11 μm, and an interval between chucks is 20 mm. A tensile velocity is 5 mm/min. and a measurement temperature is approximately at room temperature (20° C. to 25° C.). Here, the "average elongation at break (EL)" is an average of measured values of not less than five cured films obtained on the same conditions. Table 3 shows the Tg and EL measured.

[Evaluation of Adhesion (Stud Pull Test)]

By spin coating, the solutions (M1 to M10) of the positive-type photosensitive resin composition obtained in Examples 1 to 9 and Comparative Example 1 were applied onto a substrate (substrate obtained by forming TiN on a silicon substrate by sputtering and further forming Cu thereon by sputtering), and heated for 5 minutes at 100° C. to form a coating having a thickness of approximately 12 to 14 μm. This coating was cured by the above-mentioned method (i) or (ii) to obtain a cured film having a thickness of approximately 10 μm. This cured film was cut to small pieces with the substrate, and the cured film was bonded to a stud made of aluminum through an epoxy resin layer. Next, the stud was pulled to measure a load when the cured film was peeled off. Table 3 shows the result.

[Evaluation of Thermal Shock Resistance (Temperature Cycle Test)]

By spin coating, the solutions (M1 to M10) of the positive-type photosensitive resin composition obtained in Examples 1 to 9 and Comparative Example 1 were applied onto a substrate having a formed redistribution layer, and heated at 100° C. for 5 minutes to form a coating having a thickness of approximately 20 μm. This coating was exposed at a full wave length (500 mJ/cm$^2$) through a mask using a proximity exposure machine ("PLA-600FA" made by Canon Inc.). After exposure, development was performed by a 2.38% aqueous solution of TMAH. This coating having a formed via hole of a 200 μm square was cured by the above-mentioned method (i) or (ii) to form a cover coat film. An under-barrier metal was formed in an opening portion. Then, a solder ball was bumped to produce a test component provided with a wiring structure shown in FIG. 7. Further, the test component was mounted and encapsulated to produce a test sample. A temperature cycle test (–55° C. to 125° C., 1000 cycles) was performed on the test sample, and presence of defectives such as cracks and peeling-off was observed. Table 3 shows the result.

TABLE 3

| | Positive-type photosensitive resin composition | Curing conditions | Shrinkage ratio (%) | Tg (° C.) | EL (%) | Stud pull test Load (kgf/cm²) | Temperature cycle test Presence of defectives |
|---|---|---|---|---|---|---|---|
| Example 1 | M1 | i | 8 | 195 | 10 | 320 | None |
| | | ii | 9 | 197 | 12 | 330 | None |
| Example 2 | M2 | i | 9 | 189 | 15 | 450 | None |
| Example 3 | M3 | i | 10 | 192 | 11 | 370 | None |
| Example 4 | M4 | i | 11 | 193 | 15 | 400 | None |
| Example 5 | M5 | i | 11 | 181 | 20 | 360 | None |
| Example 6 | M6 | i | 12 | 185 | 16 | 310 | None |
| Example 7 | M7 | i | 14 | 184 | 15 | 320 | None |
| Example 8 | M8 | i | 15 | 180 | 12 | 380 | None |
| Example 9 | M9 | i | 9 | 195 | 10 | 400 | None |
| Comparative Example 1 | M10 | i | 10 | Measurement is impossible. | | 200 | Exist |

(1 kgf/cm² = 0.1 MPa)

As apparently from Table 2 and Table 3, the positive-type photosensitive resin compositions M1 to M9 according to Examples 1 to 9 had high sensitivity and resolution, and each of the cured films formed of the M1 to M9 showed a low shrinkage ratio of not more than 15%.

The positive-type photosensitive resin compositions M1 to M9 according to Examples 1 to 9 cured even at 175° C. showed a good Tg (not less than 179° C.) and EL (not less than 10%). The high elongation at break shows that the cured films of the positive-type photosensitive resin compositions M1 to M9 according to Examples 1 to 9 have sufficiently excellent mechanical properties. Moreover, the positive-type photosensitive resin composition M1 according to Example 1 cured by a microwave at 165° C. (on the curing conditions ii) has a Tg and EL more improved than those in the case where the positive-type photosensitive resin composition M1 according to Example 1 was thermally cured at 175° C. (on the curing conditions i), and shows that curing at a lower temperature is possible. Further, the result of the stud pull test shows that the cured films of the positive-type photosensitive resin compositions M1 to M9 according to Examples 1 to 9 have sufficient high adhesion to copper, and the result of the temperature cycle test shows that the cured films thereof have sufficiently high thermal shock resistance.

On the other hand, the positive-type photosensitive resin composition M10 according to Comparative Example 1, in which a phenol resin modified by a compound (drying oil) having an unsaturated hydrocarbon group having 4 to 100 carbon atoms is not used, has high sensitivity and resolution and a low shrinkage ratio of the cured film. However, the positive-type photosensitive resin composition M10 was fragile so that the Tg and EL could not be measured, and had low adhesion to copper and low thermal shock resistance.

The invention claimed is:

1. A positive-type photosensitive resin composition comprising:
   a phenol resin modified by a drying oil, wherein the drying oil has an iodine number of not less than 130, and the drying oil includes an ester of at least one saturated fatty acid including 8 to 30 carbon atoms with glycerol;
   a photo acid generator;
   a thermal crosslinking agent; and
   a solvent,
   wherein the phenol resin modified by the drying oil obtained by
   (i) a polycondensation reaction of (a) a reaction product of at least phenol or a derivative thereof and the drying oil with (b) aldehydes, or
   (ii) reacting (a) a phenol resin, which is produced by a polycondensation reaction of phenol or a derivative thereof with aldehydes, with (b) the drying oil.

2. The positive-type photosensitive resin composition according to claim 1, wherein the photo acid generator is an o-quinone diazide compound.

3. The positive-type photosensitive resin composition according to claim 1, containing 3 to 100 parts by mass of the photo acid generator based on 100 parts by mass of the phenol resin modified by the drying oil.

4. The positive-type photosensitive resin composition according to claim 1, further comprising an elastomer.

5. The positive-type photosensitive resin composition according to claim 1, wherein the phenol resin modified by the drying oil is obtained by (i) a polycondensation reaction of (a) a reaction product of at least phenol or a derivative thereof and the drying oil with (b) aldehydes.

6. The positive-type photosensitive resin composition according to claim 5, wherein the ester has 2-30 unsaturated bonds.

7. The positive-type photosensitive resin composition according to claim 1, wherein in (i), the phenol resin modified by the drying oil is by combining (a) a compound obtained by reacting phenol or a derivative thereof and the drying oil with a compound other than phenol, and then polycondensing with (b) aldehydes.

8. The positive-type photosensitive resin composition according to claim 1, wherein the phenol resin modified by the drying oil is obtained by (ii) reacting (a) a phenol resin, which is produced by a polycondensation reaction of phenol or a derivative thereof with aldehydes, with (b) the drying oil.

9. The positive-type photosensitive resin composition according to claim 1, wherein the phenol resin modified by the drying oil is obtained by (ii) reacting (a) a phenol resin, which is produced by a polycondensation reaction of phenol or a derivative thereof with aldehydes, with (b) the drying oil, and the phenol resin modified by the drying oil is acid-modified by reacting the phenol resin modified by the drying oil with a polybasic acid anhydride.

10. The positive-type photosensitive resin composition according to claim 1, wherein the thermal crosslinking agent includes at least one compound selected from the group consisting of a compound having a phenolic hydroxyl group, a compound having a hydroxyl methylamino group, and a compound having an epoxy group.

11. A positive-type photosensitive resin composition comprising:
- a modified phenol resin;
- a photo acid generator;
- a thermal crosslinking agent; and
- a solvent, wherein the modified phenol resin is obtained by (i) a polycondensation reaction of (a) a reaction product of at least phenol or a derivative thereof and an ester with (b) aldehydes, or (ii) reacting (a) a phenol resin, which is produced by a polycondensation reaction of phenol or a derivative thereof with aldehydes, with (b) an ester, wherein the ester is an ester of at least one unsaturated fatty acid including 8 to 30 carbon atoms with a monohydric, dihydric, or trihydric alcohol including 1 to 10 carbon atoms.

* * * * *